United States Patent
Yu et al.

(10) Patent No.: US 7,763,480 B2
(45) Date of Patent: Jul. 27, 2010

(54) METHOD FOR MANUFACTURING THIN FILM TRANSISTOR ARRAY SUBSTRATE

(75) Inventors: Wei-Sheng Yu, Hsinchu (TW); Chien-Hung Chen, Hsinchu (TW)

(73) Assignee: Au Optronics Corporation, Hsinchu (TW)

( * ) Notice: Subject to any disclaimer, the term of this patent is extended or adjusted under 35 U.S.C. 154(b) by 0 days.

(21) Appl. No.: 12/369,742

(22) Filed: Feb. 12, 2009

(65) Prior Publication Data
US 2009/0142864 A1    Jun. 4, 2009

Related U.S. Application Data

(62) Division of application No. 11/558,451, filed on Nov. 10, 2006.

(30) Foreign Application Priority Data
Jun. 20, 2006   (TW) .............................. 95122009 A

(51) Int. Cl.
*H01L 21/00* (2006.01)
(52) U.S. Cl. ......................................... 438/29; 257/59
(58) Field of Classification Search ....................... None
See application file for complete search history.

(56) References Cited

U.S. PATENT DOCUMENTS

| | | | | |
|---|---|---|---|---|
| 5,334,860 A * | 8/1994 | Naito | ........................... | 257/59 |
| 5,621,556 A * | 4/1997 | Fulks et al. | ................... | 349/42 |
| 6,211,928 B1 * | 4/2001 | Oh et al. | ........................ | 349/43 |
| 6,388,726 B1 * | 5/2002 | Kim et al. | ................... | 349/141 |
| 6,503,772 B1 * | 1/2003 | Ohtsu et al. | ................... | 438/30 |
| 6,762,805 B2 * | 7/2004 | Ishino | ......................... | 349/46 |
| 6,774,975 B2 * | 8/2004 | Ahn | ............................ | 349/156 |
| 2003/0008436 A1 * | 1/2003 | Tanaka et al. | ................ | 438/149 |
| 2005/0117082 A1 * | 6/2005 | Tanaka et al. | ................. | 349/44 |
| 2006/0176414 A1 * | 8/2006 | Chen et al. | ..................... | 349/43 |

* cited by examiner

*Primary Examiner*—Ha Tran T Nguyen
*Assistant Examiner*—Shantanu C Pathak
(74) *Attorney, Agent, or Firm*—Jianq Chyun IP Office

(57) ABSTRACT

A method for manufacturing a thin film transistor (TFT) array substrate needs only or even less than six mask processes for manufacturing the TFT array substrate integrated with a color filter pattern. Therefore, the manufacturing method is simpler and the manufacturing cost is reduced. In addition, the manufacturing method needs not to form a contact window in a relative thick film layer such as a planarization layer or a color filter layer, so as to connect the pixel electrode to the source/drain. Thus, the difficulty of the manufacturing process is effectively reduced.

10 Claims, 23 Drawing Sheets

METHOD FOR MANUFACTURING THIN FILM TRANSISTOR ARRAY SUBSTRATE

CROSS-REFERENCE TO RELATED APPLICATION

This application is a divisional of and claims priority benefit of an application Ser. No. 11/558,451, filed on Nov. 10, 2006, now pending, which claims the priority benefit of Taiwan application serial no. 95122009, filed on Jun. 20, 2006. The entirety of each of the above-mentioned patent applications is hereby incorporated by reference herein and made a part of this specification.

BACKGROUND OF THE INVENTION

1. Field of Invention

The present invention relates to a thin film transistor (TFT) array substrate and a method for manufacturing the same, and more particularly, to a TFT array substrate with a color filter on array (COA) and a method for manufacturing the same.

2. Description of Related Art

With the advantages of high definition, small volume, light weight, low voltage drive, low power consumption and wide applications, the liquid crystal display (LCD) has replaced the cathode ray tube (CRT) to become the mainstream of the new generation display. The conventional liquid crystal display (LCD) panel is formed by a color filter substrate, a TFT array substrate and a liquid crystal layer sandwiched there-between. In order to enhance the resolution of the panel and the aperture ratio of the pixels of the panel, and to avoid the alignment error when the color filter substrate is assembled to the TFT array substrate, a color filter on array (hereafter called COA) technique has been provided.

US Patent Publication NO. 20050117082 provides a structure integrated color filter patterns with a TFT array substrate and a manufacturing method thereof. FIG. 1 is a top view of the TFT array substrate, and FIG. 2 is a partial cross-sectional view of the TFT array substrate of FIG. 1. Referring to FIGS. 1 and 2, when manufacturing the TFT array substrate, firstly, a Ti/Al metal layer is formed on a transparent glass substrate 101, and gates 102 and gate lines 201 are patterned by the first mask process. Next, a gate insulating layer 103 made of silicon nitride ($SiN_x$), an amorphous silicon (a-Si) layer 104, an n-doped a-Si (n+a-Si) layer 105 and a chromium (Cr) layer 106 are deposited over the substrate 101 in succession, and then, the second mask process is performed to form island structures and data lines 202. Then, the light transitive red photosensitive resin, green photosensitive resin and blue photosensitive resin are formed over the substrate 101 in sequence, and then, the third to fifth mask processes are performed, so as to form the red filter units, green filter units and blue filter units in the specific pixel areas.

Referring to FIGS. 1 and 2, through the sixth mask process, an opaque black photosensitive resin 240 is formed over the island structures, the gate lines 201 and the data lines 202, wherein a part of the black photosensitive resin 240 over the channel area of the island structures is removed, and the black photosensitive resin 240 located over the gate terminal ports 251 is also removed. Then, the black photosensitive resin 240 serves as the mask to perform the etching process, so as to form the TFT structures. Next, a transparent photosensitive resin is completely formed over the substrate 101 to serve as a planarization layer 107, and then, through the seventh mask process, openings are formed in the planarization layer 107 over a part of the sources/drains 206, a part of the gate terminal ports 251 and a part of the data terminal ports 261 respectively. Moreover, the planarization layer 107 serves as a mask to etch the black photosensitive resin 240 and to etch the gate insulating layer 103 on the gate terminal ports 251, so as to form contact windows 221, gate terminal port contact windows 252 and data terminal port contact windows 262 on the corresponding island structures. Next, a transparent electrode layer 108 is formed on the planarization layer 107, and then, the eighth mask process is performed to form pixel electrodes 203, which are connected to the corresponding sources/drains 206 via the corresponding contact windows 221, and form gate terminal port contacts 250 and data terminal port contacts 260. Till now, the process of manufacturing a TFT array substrate almost has been finished.

It should be noted that, the conventional method of manufacturing the TFT array substrate needs at least eight mask processes, thus, the steps are complex and the manufacturing cost is relatively high. Moreover, since contact windows with high aspect ratio are required to be formed in relatively thick film layers such as the color filter layer and the planarization layer, for connecting the pixel electrodes and the corresponding sources/drains, the difficulty of the manufacturing process is relatively increased, and the production yield is affected.

SUMMARY OF THE INVENTION

Accordingly, an objective of the present invention is to provide a TFT array substrate, with relatively simple manufacturing process and lower manufacturing cost.

Another objective of the present invention is to provide a method of manufacturing the TFT array substrate, with relatively simplified processing steps and superior production yield.

In order to achieve the above or other objectives, the present invention provides a method of manufacturing a TFT array substrate. Firstly, a substrate is provided, and a patterned first conductive layer, a patterned insulating layer and a patterned channel layer are formed over the substrate, so as to form a plurality of gate lines on the substrate that are parallel to each other, and each gate line has a gate terminal port at a terminal. Then, a plurality of color filer patterns are formed over the substrate. At least a part of the insulating layer and the channel layer of each gate terminal port are removed, so as to expose the first conductive layer. Then, a partial thickness of the color filter patterns is removed, so as to expose the gate lines. Next, a patterned transparent electrode layer and a patterned second conductive layer are formed, so as to form a plurality of data lines, a plurality of electrode patterns and a plurality of sources/drains, wherein the data lines are parallel to each other and intersected with the gate lines to form a plurality of sub-pixel areas on the substrate, the electrode patterns are correspondingly located in the sub-pixel areas, the sources/drains are corresponding to the sub-pixel areas and disposed over the corresponding gate lines, and each source/drain is connected to the corresponding data line and the corresponding electrode pattern respectively. Then, a black matrix is formed over the substrate for at least exposing the electrode patterns, and the second conductive layer in the electrode pattern is removed with the black matrix being used as a mask.

According to an embodiment of the present invention, when the patterned transparent electrode layer and the patterned second conductive layer are formed, the method further comprises defining a plurality of gate terminal port contacts and a plurality of data terminal port contacts, wherein the gate terminal port contacts are correspondingly located on the exposed first conductive layer of the gate terminal ports, and a terminal of each data line is correspondingly connected to a data terminal port contact. Moreover, when the black matrix is formed over the substrate, the method further makes the black matrix expose the gate terminal port contacts and the data terminal port contacts. Further, the present invention further comprises removing the second conductive layer in the gate terminal port contacts and the data terminal port contacts with the black matrix being used as a mask.

According to an embodiment of the present invention, after forming the channel layer, the method further comprises: forming an ohmic contact layer, and then, patterning the first conductive layer, the insulating layer, the channel layer and the ohmic contact layer altogether; and after patterning the second conductive layer and the transparent electrode layer, the method further comprises removing the ohmic contact layer exposed by the second conductive layer and the transparent electrode layer.

Moreover, after forming the ohmic contact layer, the method further comprises: forming a contact metal layer, and then, patterning the first conductive layer, the insulating layer, the channel layer, the ohmic contact layer and the contact metal layer altogether; and after patterning the second conductive layer and the transparent electrode layer, the method further comprises further removing the contact metal layer and the ohmic contact layer exposed by the second conductive layer and the transparent electrode layer.

According to an embodiment of the present invention, when the gate lines are formed on the substrate, the method further forms a plurality of common lines parallel to and alternately arranged with the gate lines.

According to an embodiment of the present invention, the step of forming the color filter patterns comprises forming color filter layers with different colors over the substrate in sequence. Moreover, when the color filter patterns are formed, at least the color filter layer with one color is used to cover at least a part of each gate terminal port, so as to use the color filter layer as a mask to remove at least a part of the insulating layer and the channel layer of each gate terminal port, thereby exposing the first conductive layer.

According to an embodiment of the present invention, the method of removing a partial thickness of the color filter patterns comprises performing an ashing process.

According to an embodiment of the present invention, after defining the gate lines, and before forming the color filter patterns, the method further comprises completely forming a protective layer over the substrate, and when removing a partial thickness of the color filter patterns, the method further comprises removing the protective layer on the gate lines, for exposing the gate lines.

During the process of manufacturing the TFT array substrate with the protective layer, when the gate lines are formed on the substrate, a plurality of common lines parallel to and alternately arranged with the gate lines are further formed, and when the protective layer on the gate lines is removed, the protective layer on the common lines is also removed, so as to expose both the gate lines and the common lines simultaneously.

During the process of manufacturing the TFT array substrate with the protective layer, the method of removing a partial thickness of the color filter patterns and a part of the protective layer is, for example, performing an ashing process.

The present invention further provides a TFT array substrate, which comprises: a substrate, a patterned composite layer, a plurality of color filter patterns, a plurality of data lines, a plurality of pixel electrodes, a plurality of sources/drains and a black matrix. The patterned composite layer comprises a first conductive layer, an insulating layer and a channel layer, so as to form a plurality of gate lines parallel to each other on the substrate, wherein each gate line has a gate terminal port at a terminal, and the gate terminal port has an opening for exposing the first conductive layer. Moreover, the color filter patterns are disposed on the substrate, for exposing the composite layer, and the data lines are disposed on the color filter patterns, and are intersected with the gate lines, for forming a plurality of sub-pixel areas on the substrate. The gate terminal port contacts are disposed on the corresponding gate terminal ports, and coupled to the first conductive layer respectively through the openings on the gate terminal port. The data terminal port contacts are connected to a terminal of the corresponding data lines, and the pixel electrodes are disposed in the corresponding sub-pixel areas, and located on the corresponding color filter patterns. Further, the sources/drains are corresponding to the sub-pixel areas and disposed over the corresponding gate lines, so as to form TFTs with the first conductive layer and the semiconductor layer respectively, and sources/drains are connected to the corresponding data lines and the electrode patterns respectively. The black matrix is disposed over the substrate for exposing the pixel electrodes.

In an embodiment of the present invention, the TFT array substrate further comprises an ohmic contact layer disposed between the channel layer and the sources/drains. Moreover, the TFT array substrate may further comprise a contact metal layer disposed between the ohmic contact layer and the sources/drains.

In an embodiment of the present invention, the composite layer further forms a plurality of common lines parallel to and alternately arranged with the gate lines, and the color filter patterns further expose the common lines.

In an embodiment of the present invention, the color filter patterns comprise red color filter patterns, green color filter patterns and blue color filter patterns.

In an embodiment of the present invention, the TFT array substrate further comprises a patterned protective layer disposed between the color filter patterns and the substrate, and between the color filter pattern and the composite layer. Moreover, the material of the protective layer comprises silicon nitride ($SiN_x$).

In an embodiment of the present invention, the sources/drains are formed by, for example, a transparent conductive layer and a second metal layer, and the second metal layer is located on the transparent conductive layer. Moreover, the pixel electrodes are formed by the transparent conductive layer.

In an embodiment of the present invention, the TFT array substrate further comprises a plurality of gate terminal port contacts disposed on the corresponding gate terminal ports, and respectively coupled to the first conductive layer through the openings. Moreover, the TFT array substrate further comprises a plurality of data terminal port contacts connected to terminals of the corresponding data lines. Furthermore, the gate terminal port contacts or the data terminal port contacts are formed by the transparent conductive layer.

Based on the above, the present invention provides a method of manufacturing a TFT array substrate, wherein the method is integrated with the manufacture of color filter patterns, thus, the resolution of the liquid crystal display panel and the aperture ratio of the pixels of the panel are enhanced, and the alignment error when the color filter substrate is assembled with the TFT array substrate may be avoided. Moreover, the method of manufacturing the TFT array substrate provided by the present invention reduces the number of the mask processes, thus, the manufacturing process is relatively simple. Further, the TFT array substrate provided by the present invention does not need to form contact windows in the relative thick film layer such as the color filter layer and the planarization layer to connect the pixel electrodes to the corresponding sources/drains, thus the difficulty of the manufacturing process is effectively reduced, and the process yield is further enhanced.

In order to make the aforementioned and other objects, features and advantages of the present invention comprehensible, preferred embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

FIGS. 3A-3G are top views sequentially showing a method of manufacturing a TFT array substrate according to a preferred embodiment of the present invention, and FIGS. 4A-4G are cross-sectional views sequentially showing A-A' section, B-B' section, C-C' section and D-D' section in FIGS. 3A-3G.

Figure 1:
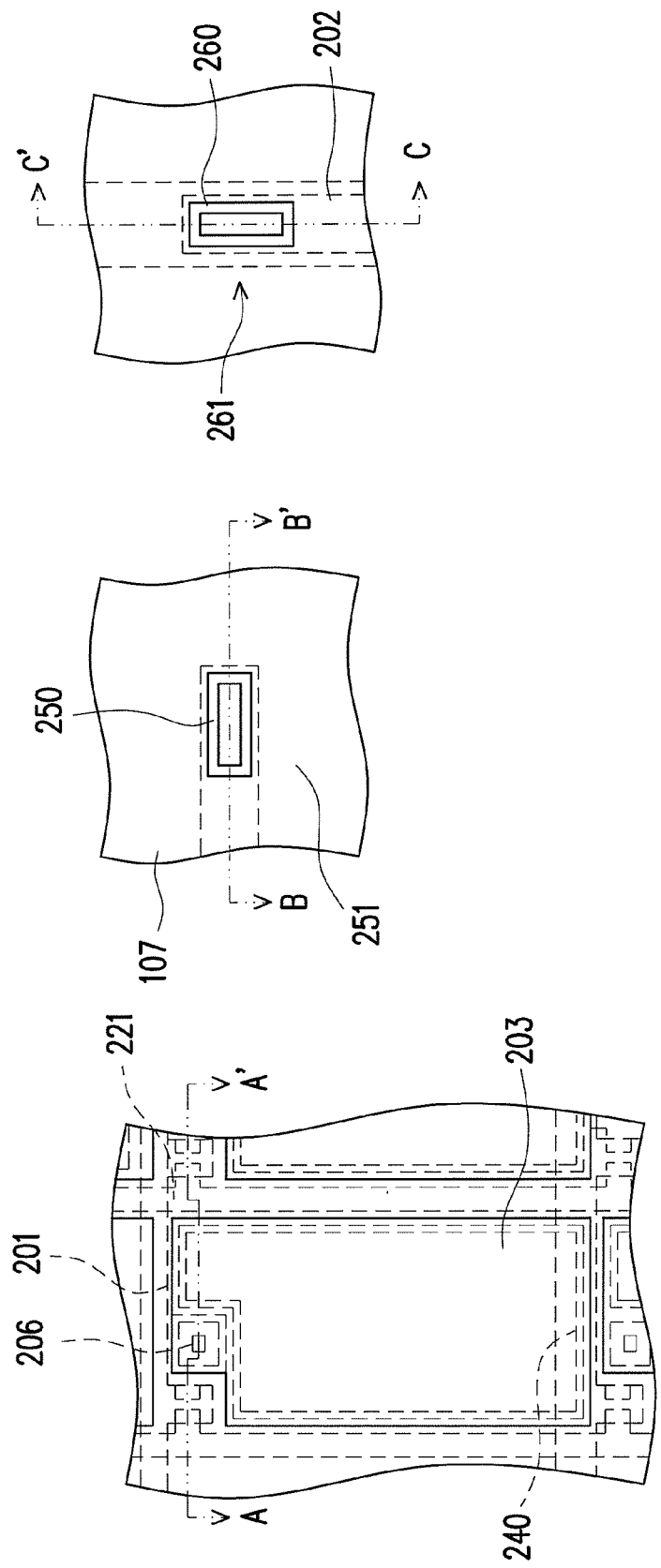
FIG. 1 is a top view of a conventional thin film transistor (TFT) array substrate integrated with color filter patterns.
Figure 2:
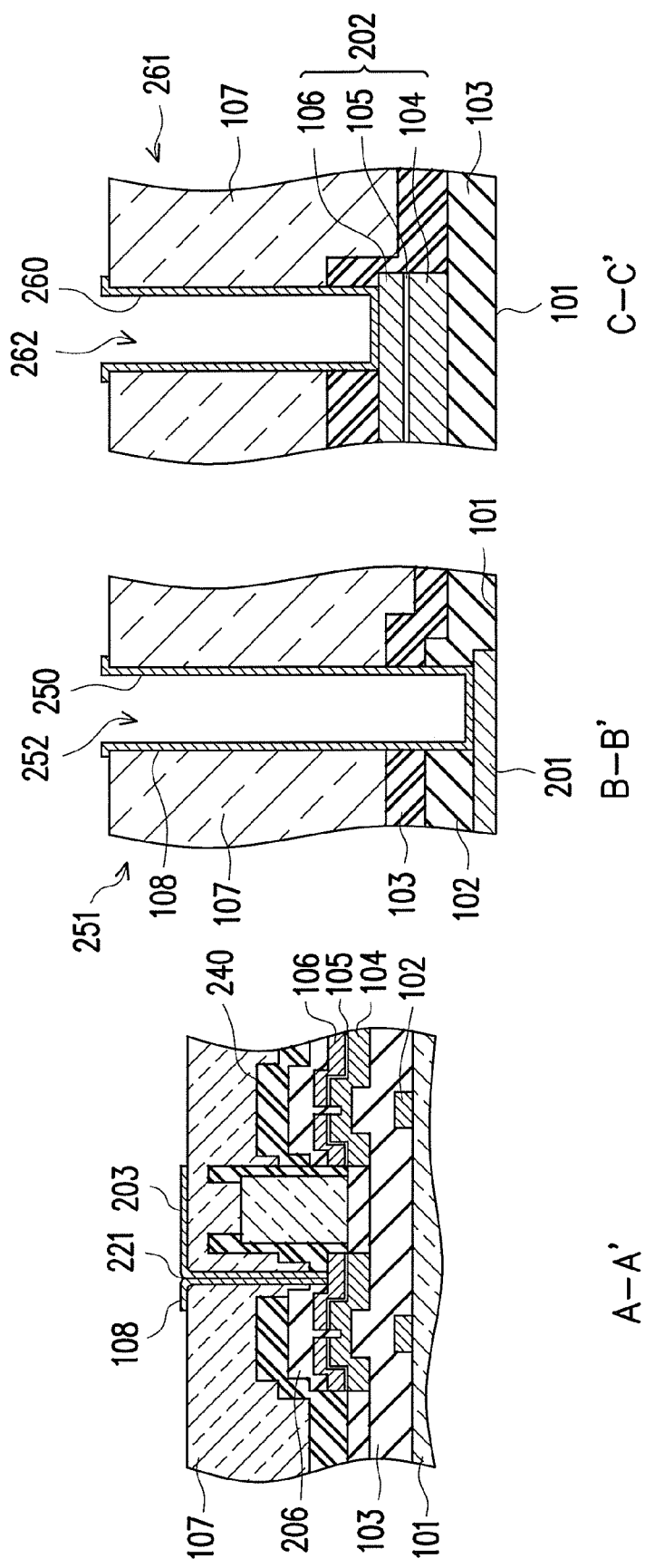
FIG. 2 is a partial cross-sectional view of the TFT array substrate of FIG. 1.
Figure 3A:
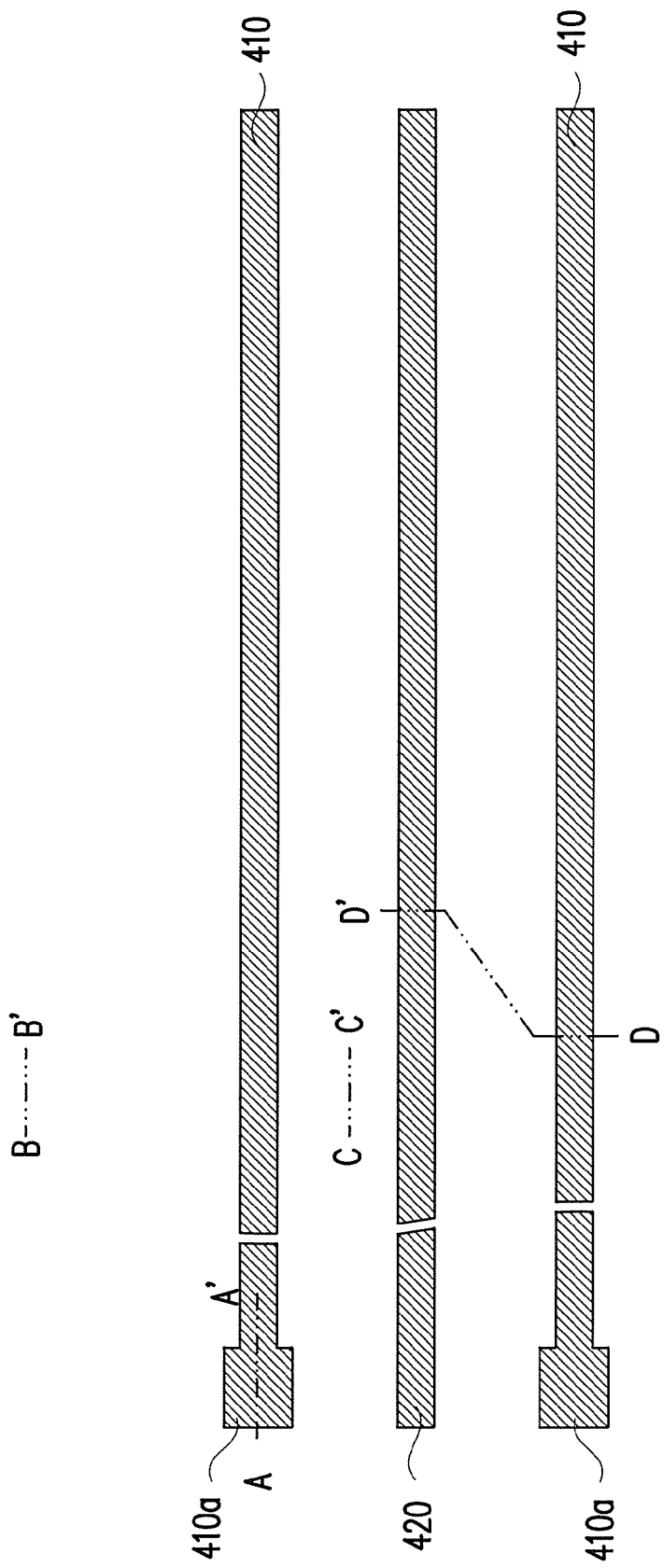
FIGS. 3A-3G are top views sequentially showing a method of manufacturing a TFT array substrate according to a preferred embodiment of the present invention.
Figure 4A:
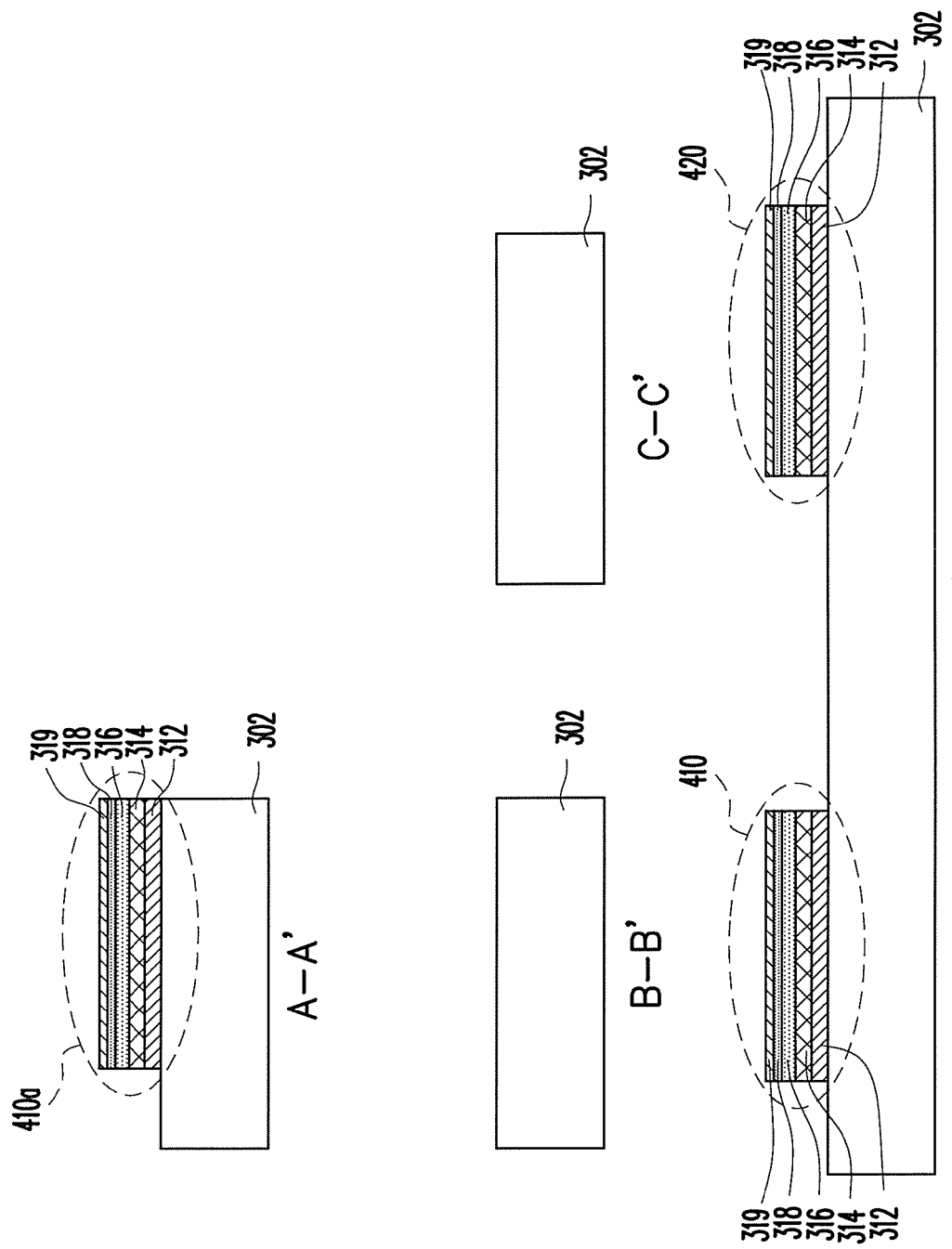
FIGS. 4A-4G are cross-sectional views sequentially showing the A-A' section, B-B' section, C-C' section and D-D' section in FIGS. 3A-3G.

Firstly, as shown in FIGS. 3A and 4A, a substrate 302 is provided, which is, for example, a transparent substrate with the glass material. Next, a plurality of film layers, including a first conductive layer 312, an insulating layer 314 and a channel layer 316, is sequentially formed over the substrate 302. The first conductive layer 312 is a metal lamination made of titanium/aluminum/titanium (Ti/Al/Ti), and it is formed by, for example, sequentially depositing metal layers, such as a Ti layer, an Al layer, a Ti layer, over the substrate 302 by sputtering. In this embodiment, a thickness of the first conductive layer 312 is about 0.1-0.3 µm. Moreover, a material of the insulating layer 314 is, for example, $SiN_x$, and it is formed on the first conductive layer 312 by, for example, plasma enhanced chemical vapor deposition (PECVD). A material of the channel layer 316 is, for example, a-Si, with a thickness of about 0.05-0.3 µm, and it is formed on the insulating layer 314 by PECVD.

Further, in order to enhance the electrical properties between the subsequently formed sources/drains and the channel layer 316, and to greatly reduce the tunneling probability of the electrons and thereby preventing the short channel effect, in the present invention, after the channel layer 316 is formed, a doped a-Si layer (e.g., n-type doped) is continuously formed on the channel layer 316, to serve as an ohmic contact layer 318 with a thickness of about 20-100 nm. Then, the present invention selectively forms a contact metal layer 319 on the ohmic contact layer 318 by sputtering, for example, so as to enhance the jointing effect between the subsequently formed sources/drains and the ohmic contact layer 318, wherein the material of the contact metal layer 319 is, for example, Ti or molybdenum (Mo), with the thickness of about 30-50 nm.

After forming the abovementioned film layers, the first mask process is performed, wherein a first photoresist layer (not shown) is formed over the film layers; next, the first photoresist layer is exposed and developed, and thereby being patterned; then, an etching process (e.g., dry etching) is performed to the film layers by using the patterned first photoresist layer as a mask, so as to form a plurality of gate lines 410 parallel to each other on the substrate 302, and each gate line has a gate terminal port 401a at a terminal. In this embodiment, when the above steps are performed, a plurality of common lines 420 parallel to and alternately arranged with the gate lines 410 is formed on the substrate 302 simultaneously.

Figure 3B:
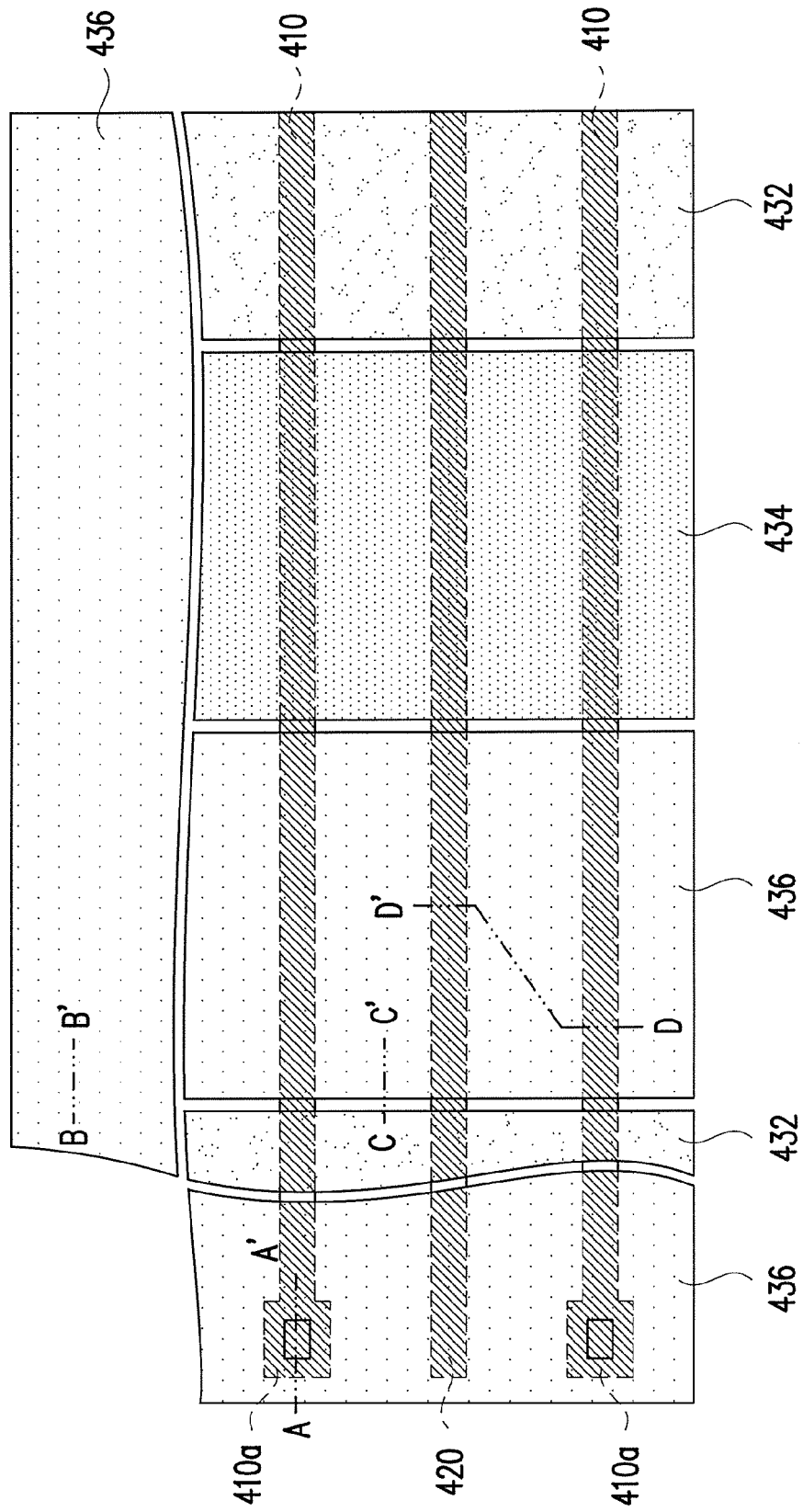
Figure 4B:
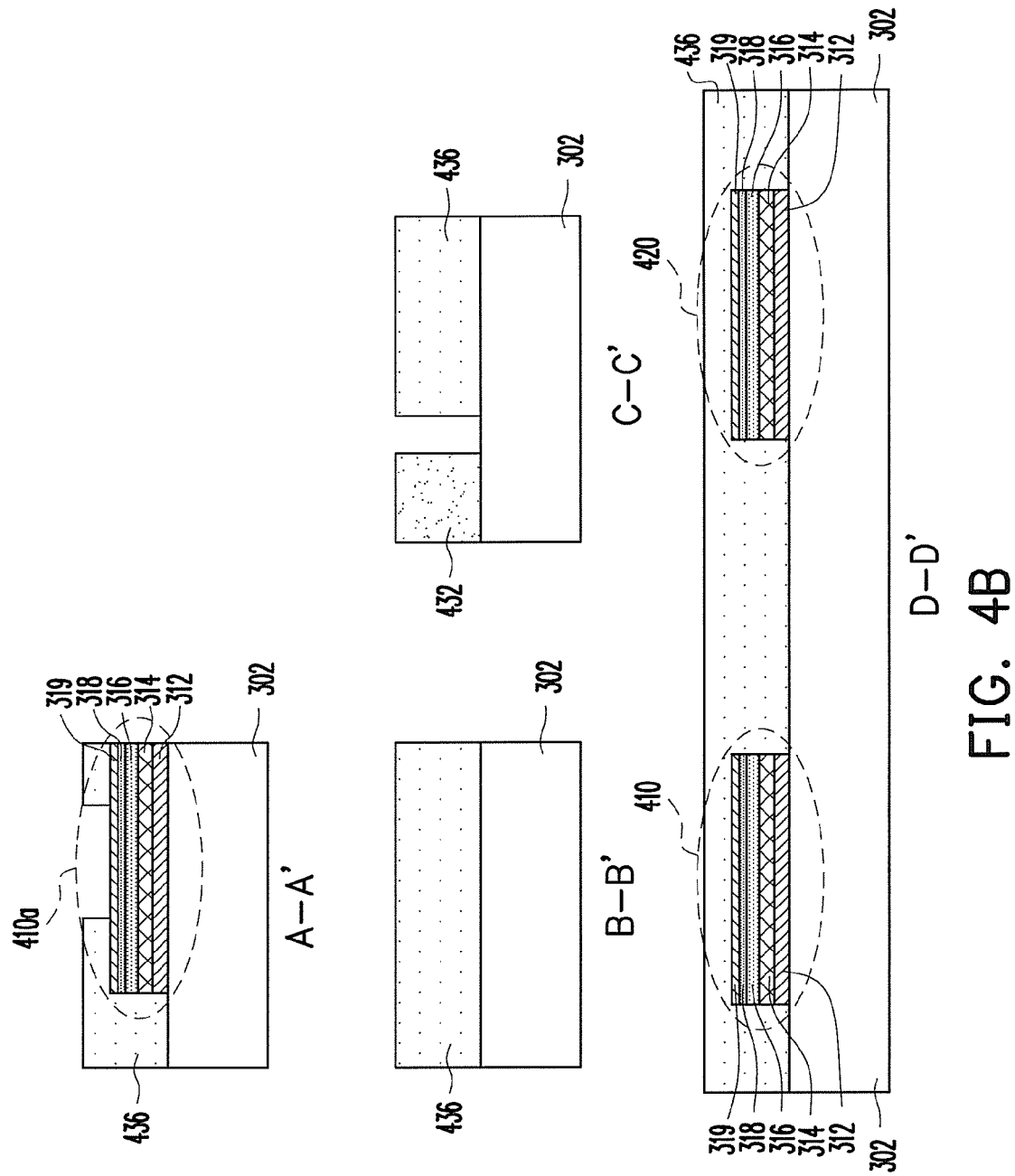

Then, as shown in FIGS. 3B and 4B, a plurality of color filter patterns is formed over the substrate 302. For example, the method of forming the color filter patterns of the present invention is, for example, to form color filter layers with different colors over the substrate 302 in sequence. Particularly, the color filter patterns formed in this embodiment may include red filter patterns 432, green filter patterns 434 and blue filter patterns 436, such that a full-color displaying effect for the liquid crystal display panel is achieved. Therefore, during the manufacturing process, firstly, a red filter layer with a thickness of about 1.5 µm is completely formed over the substrate 302. A material of the red filter layer is, for example, photosensitive acrylic resin. The red filter layer is then exposed and developed by the second mask process, so as to form the red filter patterns 432 over the substrate 302. Similarly, photosensitive resins with different colors are alternatively used to form the green filter layer and blue filter layer, and then, the green filter patterns 434 and the blue filter patterns 436 are formed by using the same processes. Of course, the present invention does not limit the color and the amount of the filter patterns, which may vary depending upon actual design requirements. Moreover, it should be mentioned that, in this embodiment, when forming the color filter patterns 432, 434 and 436, patterns of the color filter patterns 432, 434 and 436 with any color may be further used to cover at least a part of each gate terminal port 410a.

Figure 3C:
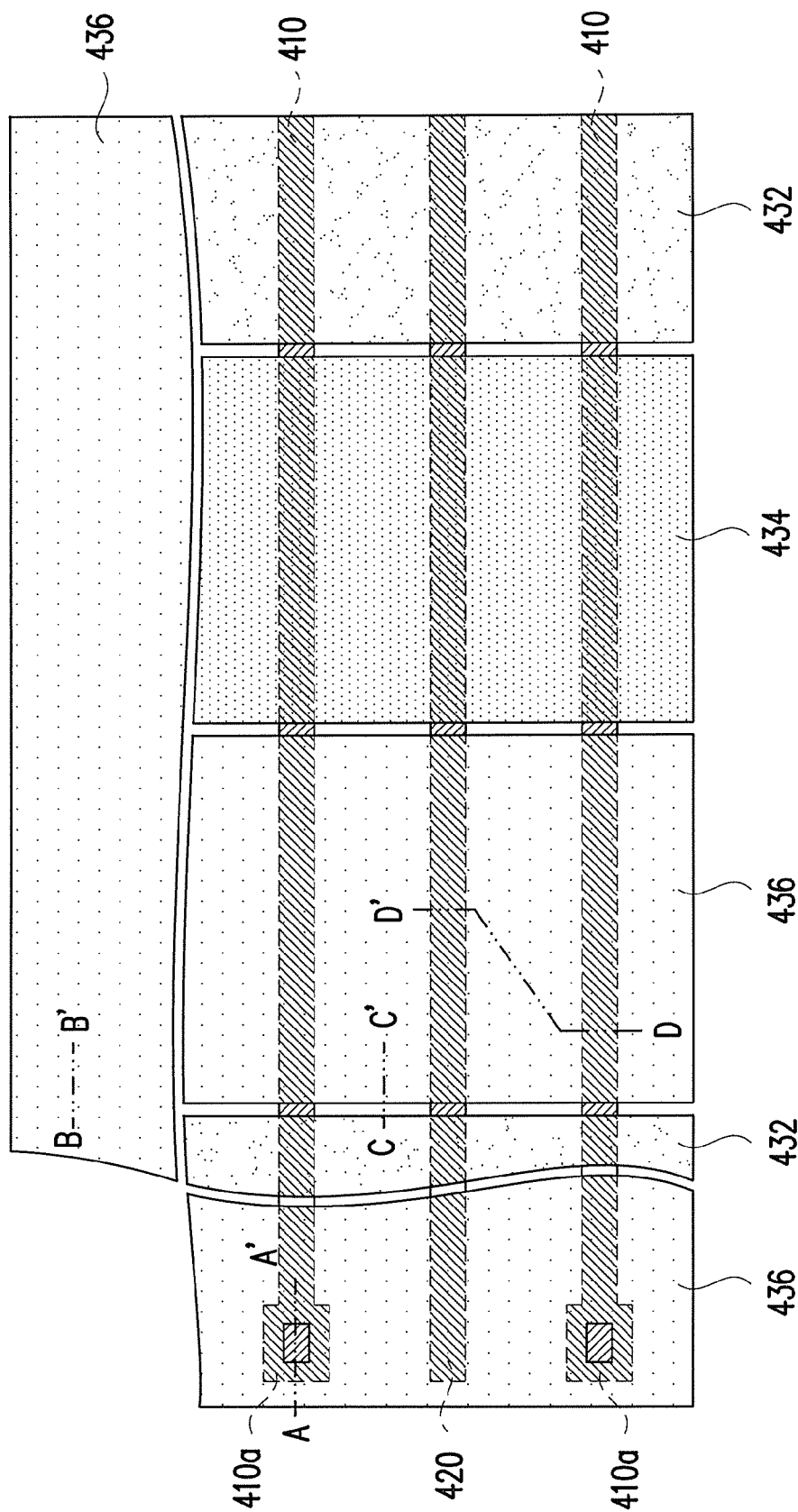
Figure 4C:
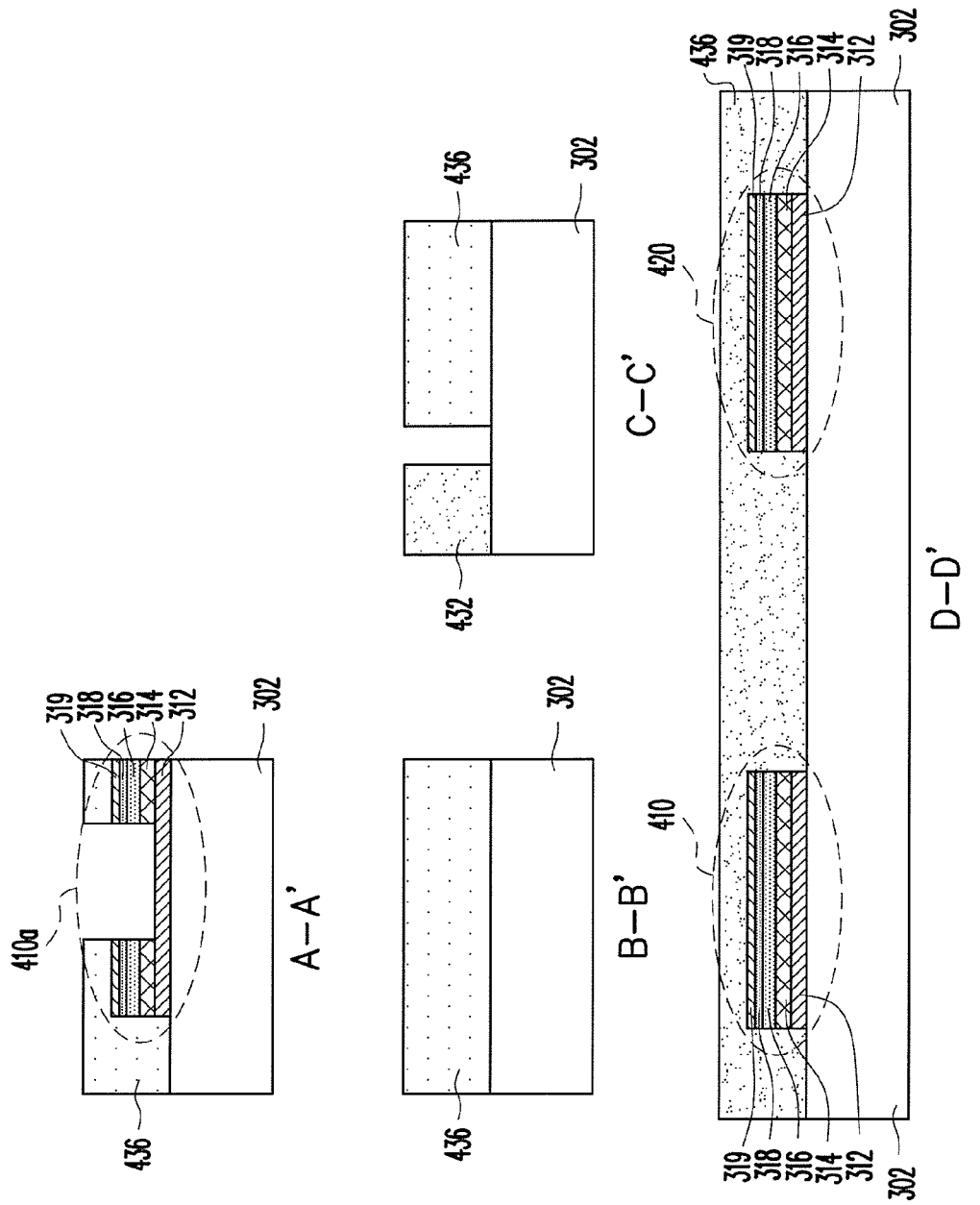

Then, as shown in FIGS. 3C and 4C, the etching process, (e.g., dry etching) is performed to the gate terminal ports 410a, so as to expose at least a part of the first conductive layer 312 of the gate terminal ports 410a. In this embodiment, the insulating layer 314, the channel layer 316, the ohmic contact layer 318, the contact metal layer 319 are formed over the first conductive layer 312, and a part of the blue filter patterns 436 covers the gate terminal ports 410a. Therefore, the blue filter patterns 436 are served as a mask to remove the insulating layer 314, the channel layer 316, the ohmic contact layer 318 and the contact metal layer 319 of the gate terminal ports 410a, so as to expose the first conductive layer 312.

Figure 3D:
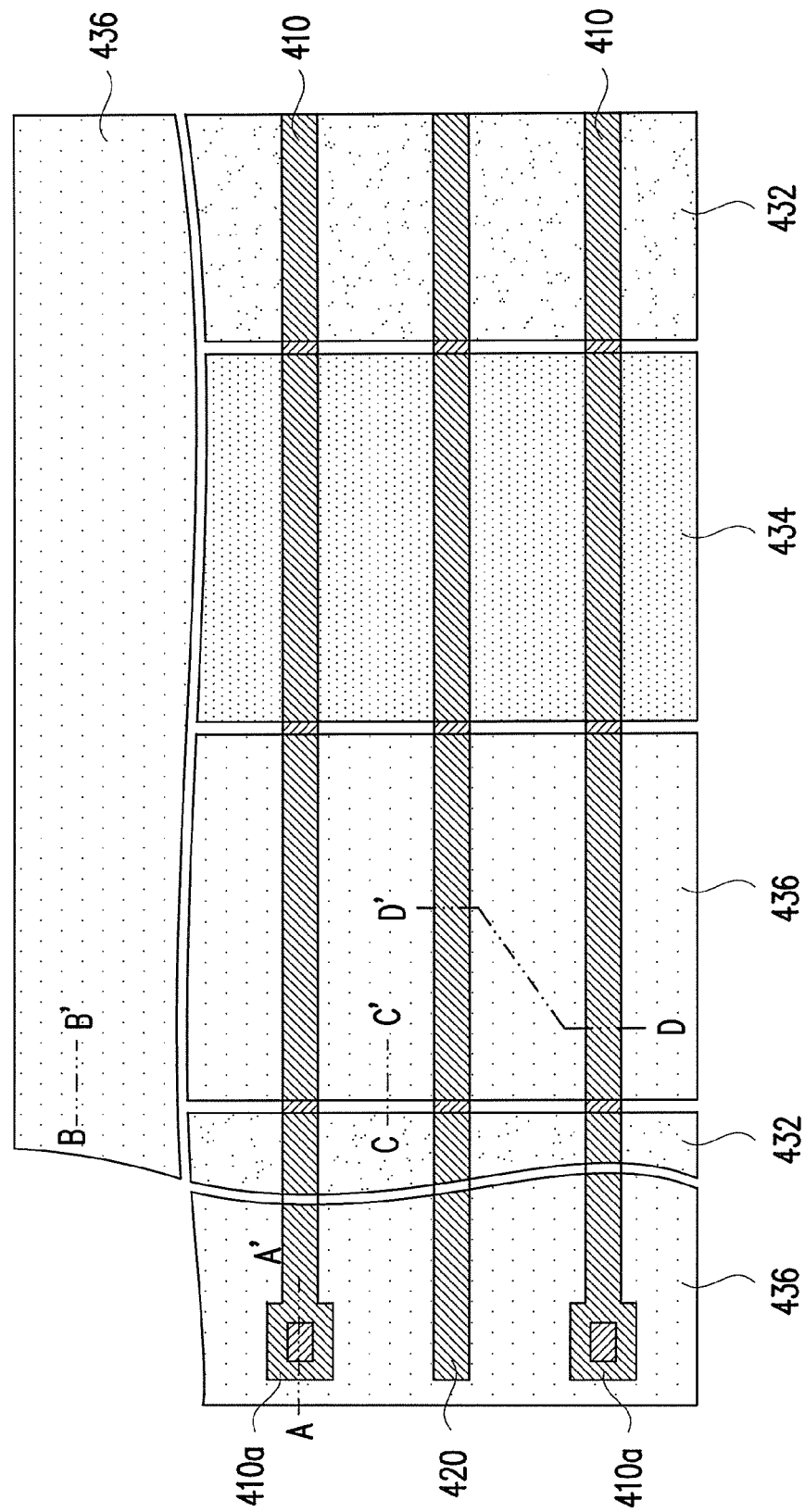
Figure 4D:
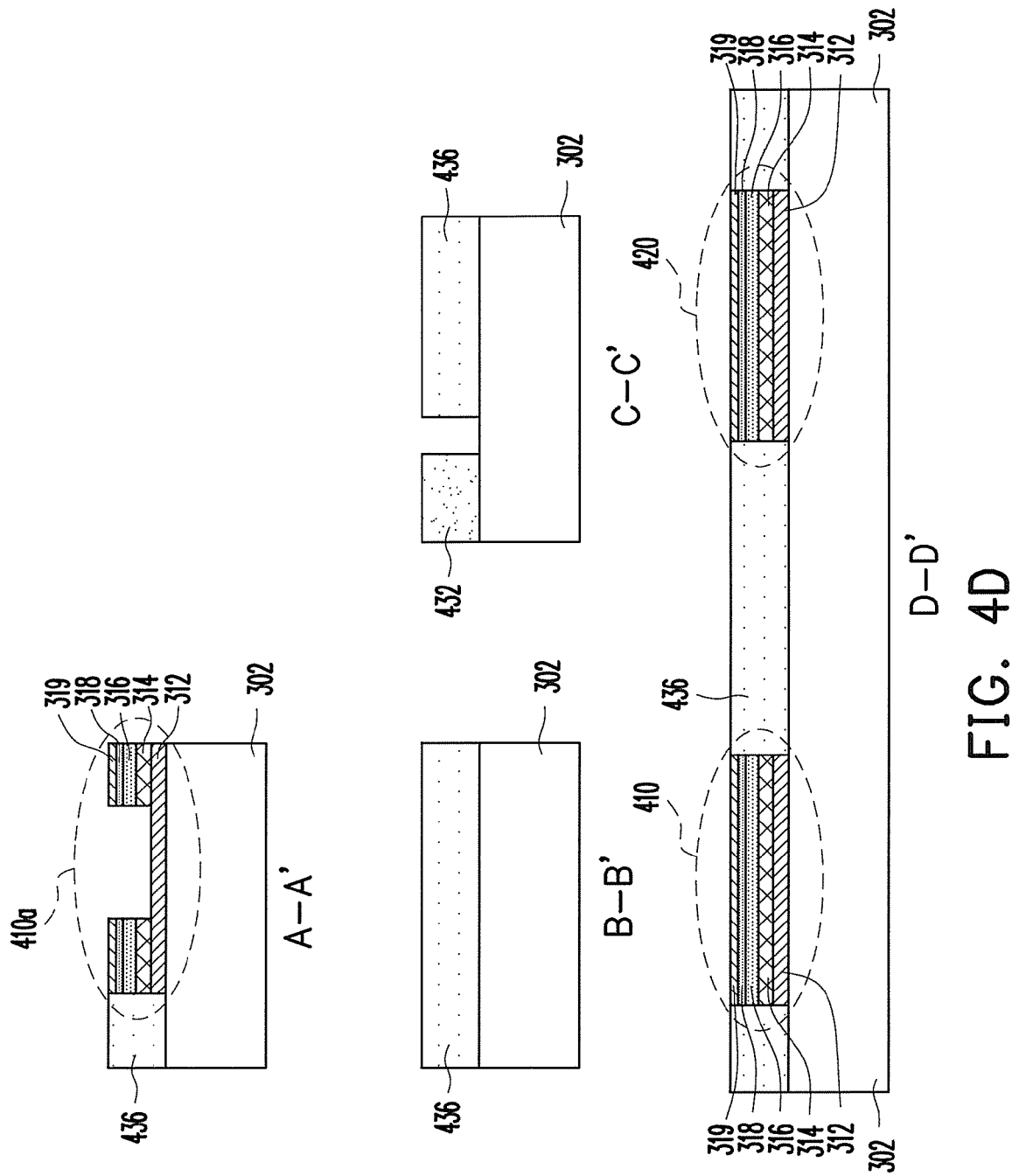

Then, as shown in FIGS. 3D and 4D, a partial thickness of the color filter patterns 432, 434 and 436 are removed to expose the gate lines 410, and this process also exposes the common lines 420 if the common lines 420 have formed as well. That is, the contact metal layer 319 previously covered by the color filter patterns 432, 434 and 436 is exposed. In this embodiment, the method of removing a partial thickness of the color filter patterns 432, 434 and 436 is, for example, to perform an ashing process to the color filter patterns 432, 434 and 436, that is, the surfaces of the color filter patterns 432, 434 and 436 are etched with the plasma.

Figure 3E:
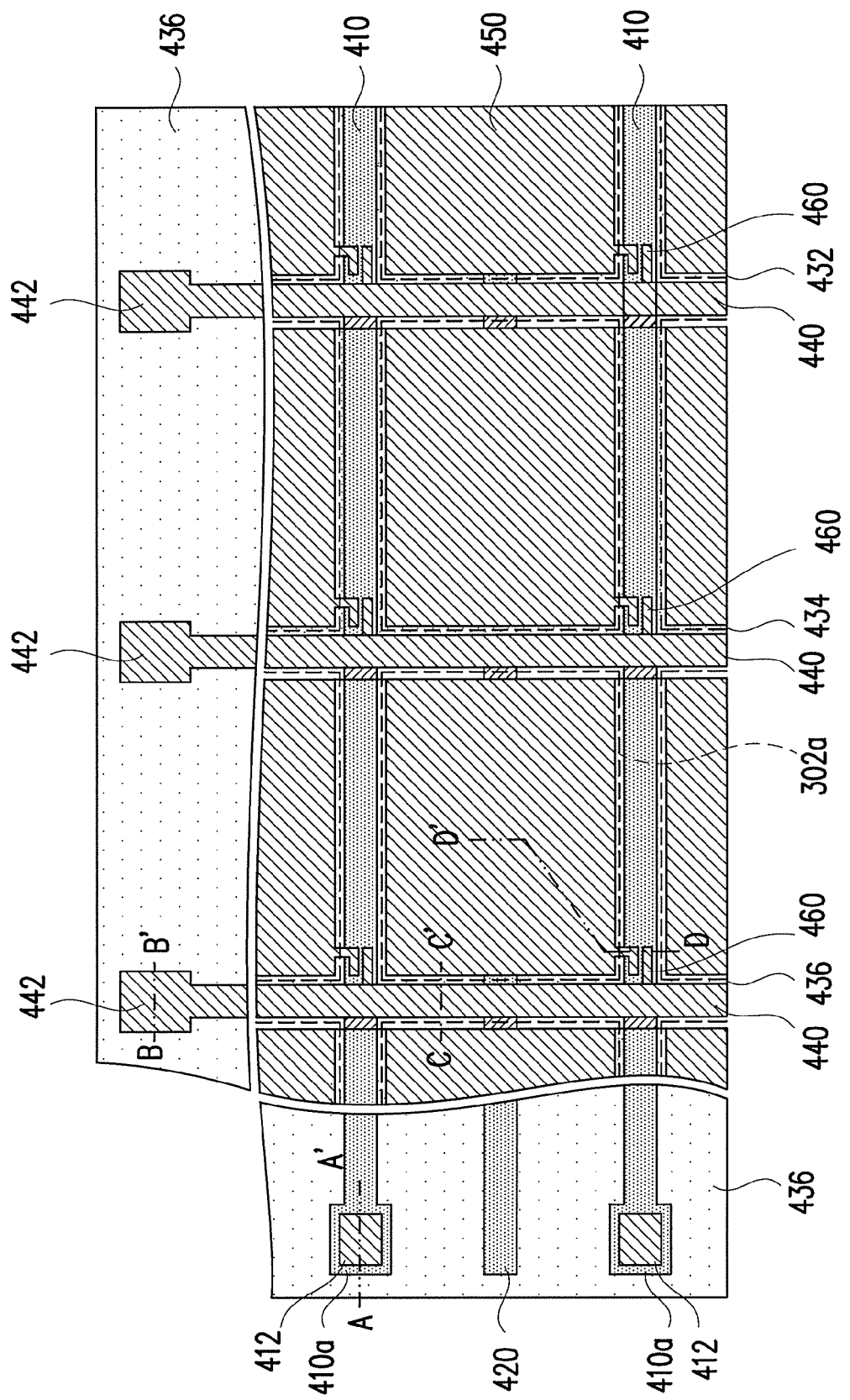
Figure 4E:
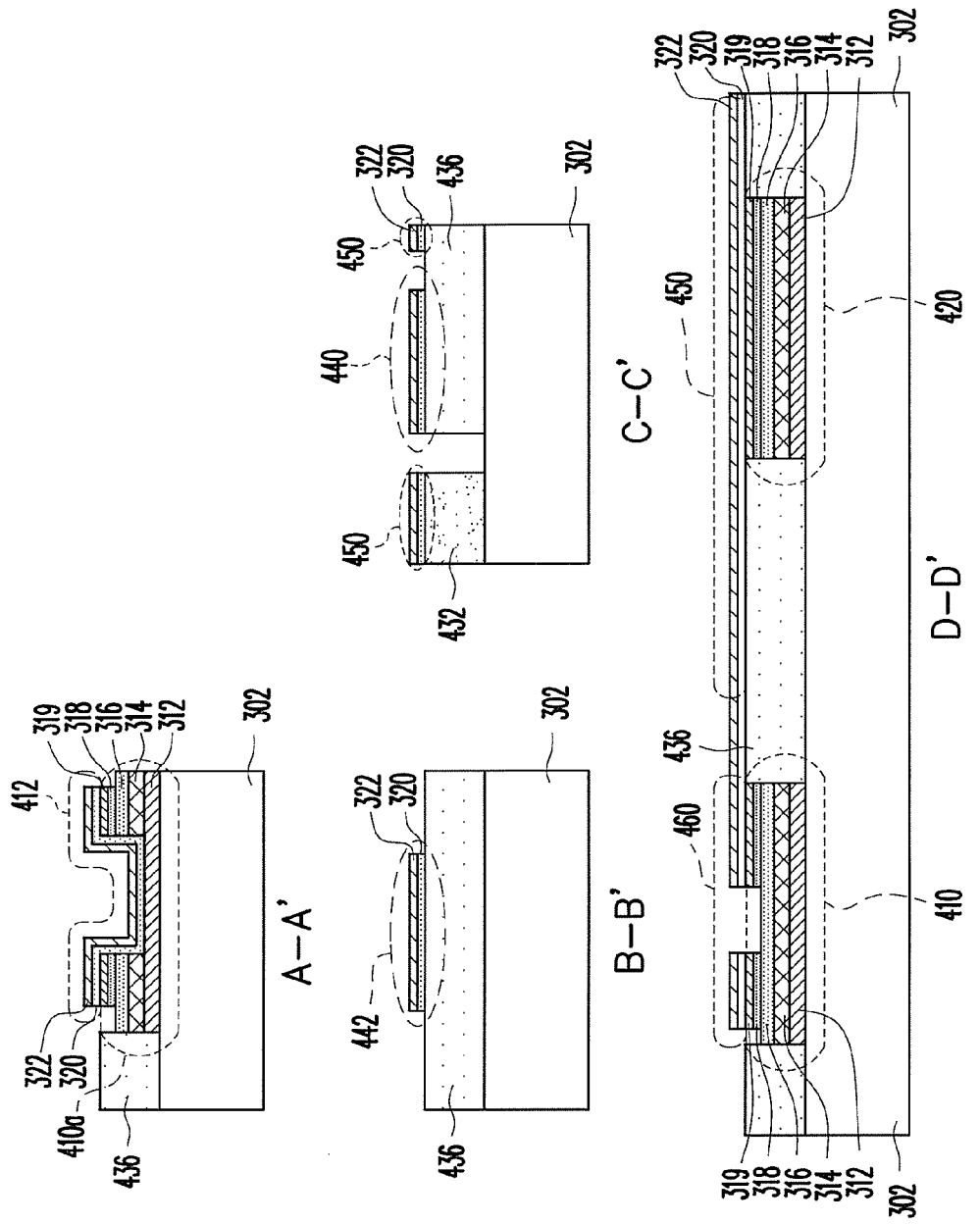

Then, as shown in FIGS. 3E and 4E, a transparent electrode layer 320 and a second conductive layer 322 are formed over the substrate 302 by sputtering, for example. Next, the second conductive layer 322 and the transparent electrode layer 320 are patterned, so as to form a plurality of gate terminal port contacts 412, a plurality of data lines 440, a plurality of data terminal port contacts 442, a plurality of electrode patterns 450 and a plurality of sources/drains 460, wherein the gate terminal port contacts 412 are correspondingly located on the exposed first conductive layer 322 of the gate terminal ports 410a, and the data lines 440 are parallel to each other and intersected with the gate lines 410 (and the common lines 420) to form a plurality of sub-pixels 302a on the substrate. Moreover, a terminal of each data line 440 is correspondingly connected to a data terminal port contact 442. The electrode patterns 450 are correspondingly located in the sub-pixel areas 302a, the sources/drains 460 are corresponding to the sub-pixel areas 302a and located over the corresponding gate lines 410, and each of the sources/drains 460 is connected to the corresponding data line 440 and the corresponding electrode pattern 450 respectively. In this embodiment, the channel layer 316 further has, for example, the ohmic contact layer 318 and the contact metal layer 319, thus, after patterning the second conductive layer 322 and the transparent electrode layer 320, the contact metal layer 319 and the ohmic contact layer 318 exposed by the second conductive layer 322 and the transparent electrode layer 320 are further required to be removed, and thereby, the sources/drains 460 and the channel layer 316 and the first metal layer 312 under the sources/drains 460 constitute TFTs.

In particular, a material of the transparent electrode layer 320 is, for example, Indium Tin Oxide (ITO), Indium Zinc Oxide (IZO) or other transparent conductive materials, and a thickness of the transparent electrode layer 320 is, for example, between about 50 and about 130 nm. Moreover, the material of the second conductive layer 322 is, for example, a metal lamination formed by Ti/Al, and the thickness of the second conductive layer 322 is, for example, between about 0.1 and about 0.2 μm. In this embodiment, the method of patterning the second conductive layer 322 and the transparent electrode layer 320 is, for example, as follows: firstly, a second photoresist layer (not shown) is formed on the second conductive layer 322 and the transparent electrode layer 320; next, the fifth mask process is performed to expose and develop the second photoresist layer, so as to pattern the second photoresist layer; then, an etching process (for example, wet etching) is performed to the second conductive layer 322 and the transparent electrode layer 320 with the patterned second photoresist layer as a mask, so as to obtain the patterned second conductive layer 322 and the transparent electrode layer 320. Moreover, the method for further removing the contact metal layer 319 and the ohmic contact layer 318 exposed by the second conductive layer 322 and the transparent electrode layer 320 is, for example, dry etching.

Figure 3F:
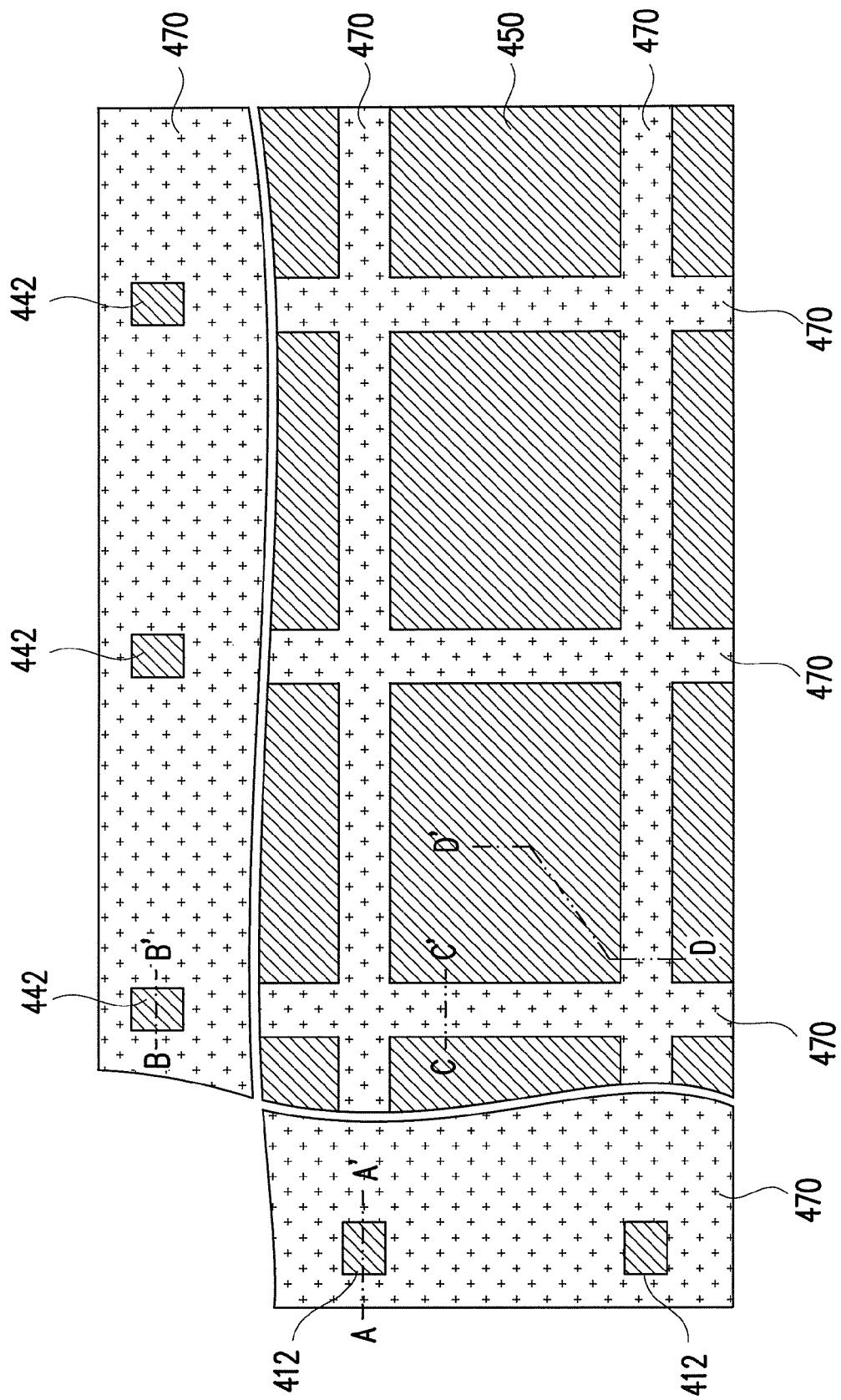
Figure 4F:
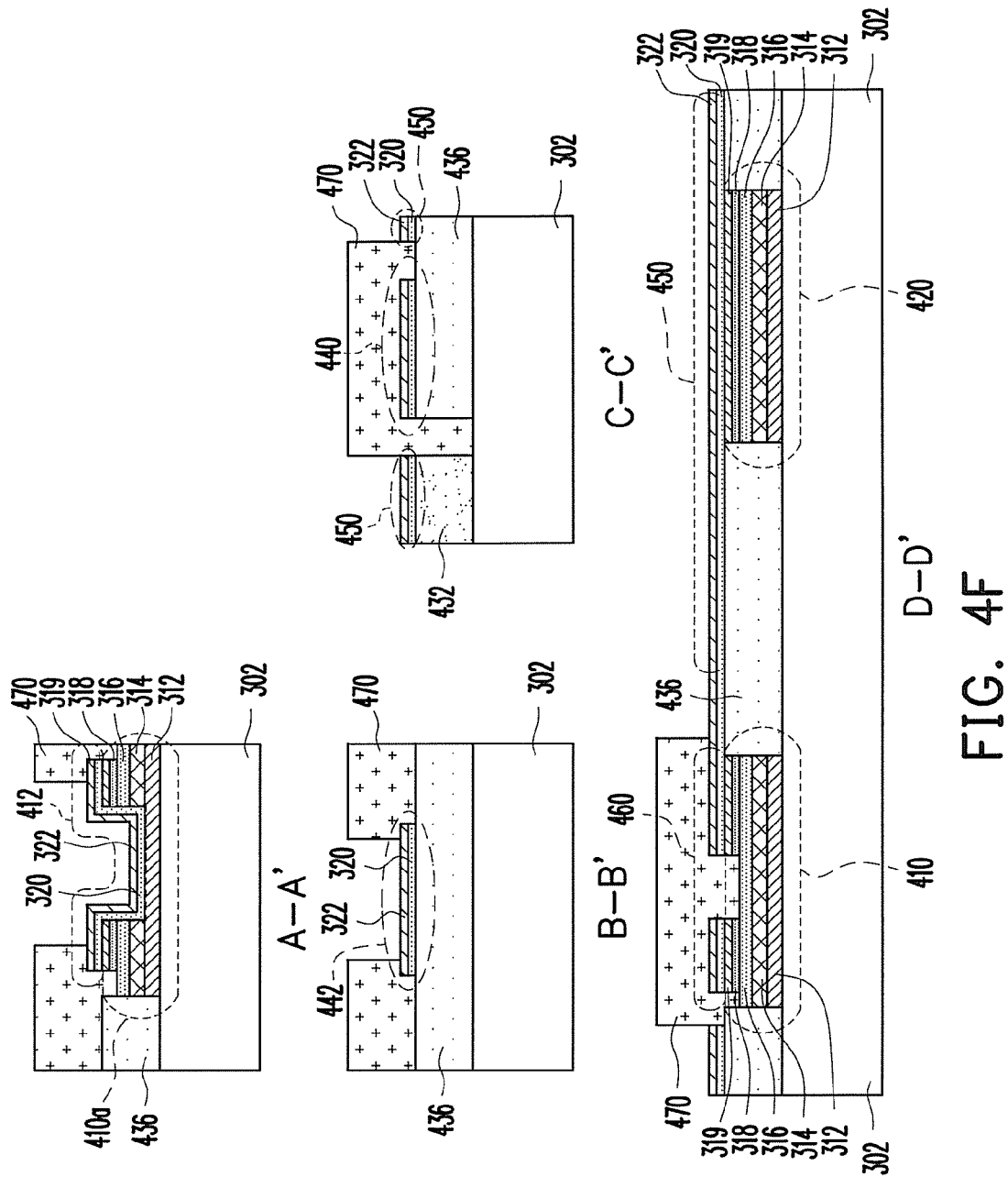

Then, as shown in FIGS. 3F and 4F, a black matrix 470 is formed over the substrate 302, and the black matrix 470 is used to at least expose a part of each gate terminal port contact 412, a part of each data terminal port contact 442 and each electrode pattern 450. In this embodiment, for example, a layer of opaque black photosensitive resin is first completely formed over the substrate 302, which is, for example, the acrylic resin with a thickness of about 1.0 μm. Then, the sixth mask process is performed to expose and develop the black photosensitive resin, so as to form the black matrix 470 covering the gate lines 410, the data lines 440, a part of each gate terminal port contact 412 and a part of each data terminal port contact 442.

Figure 3G:
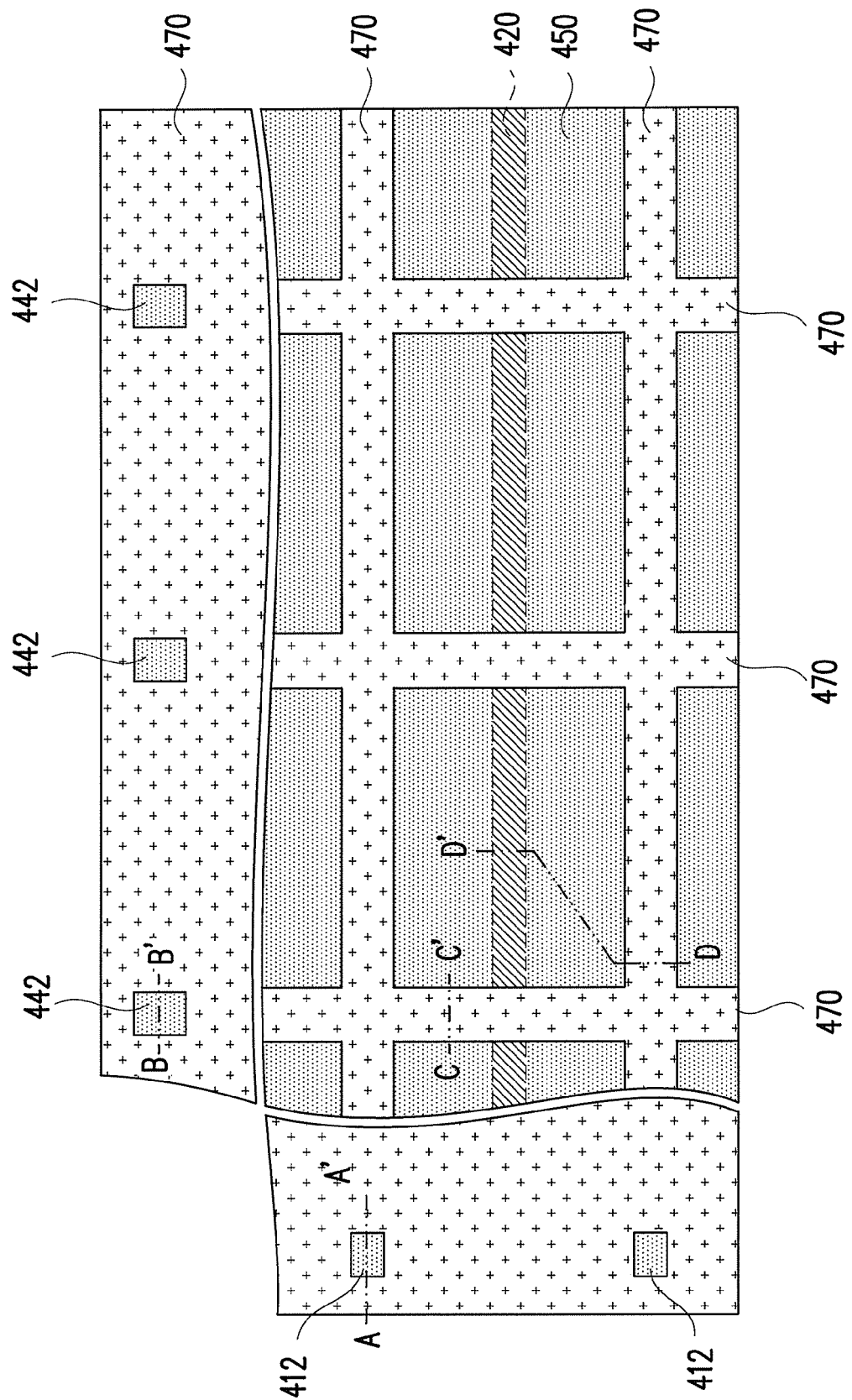
Figure 4G:
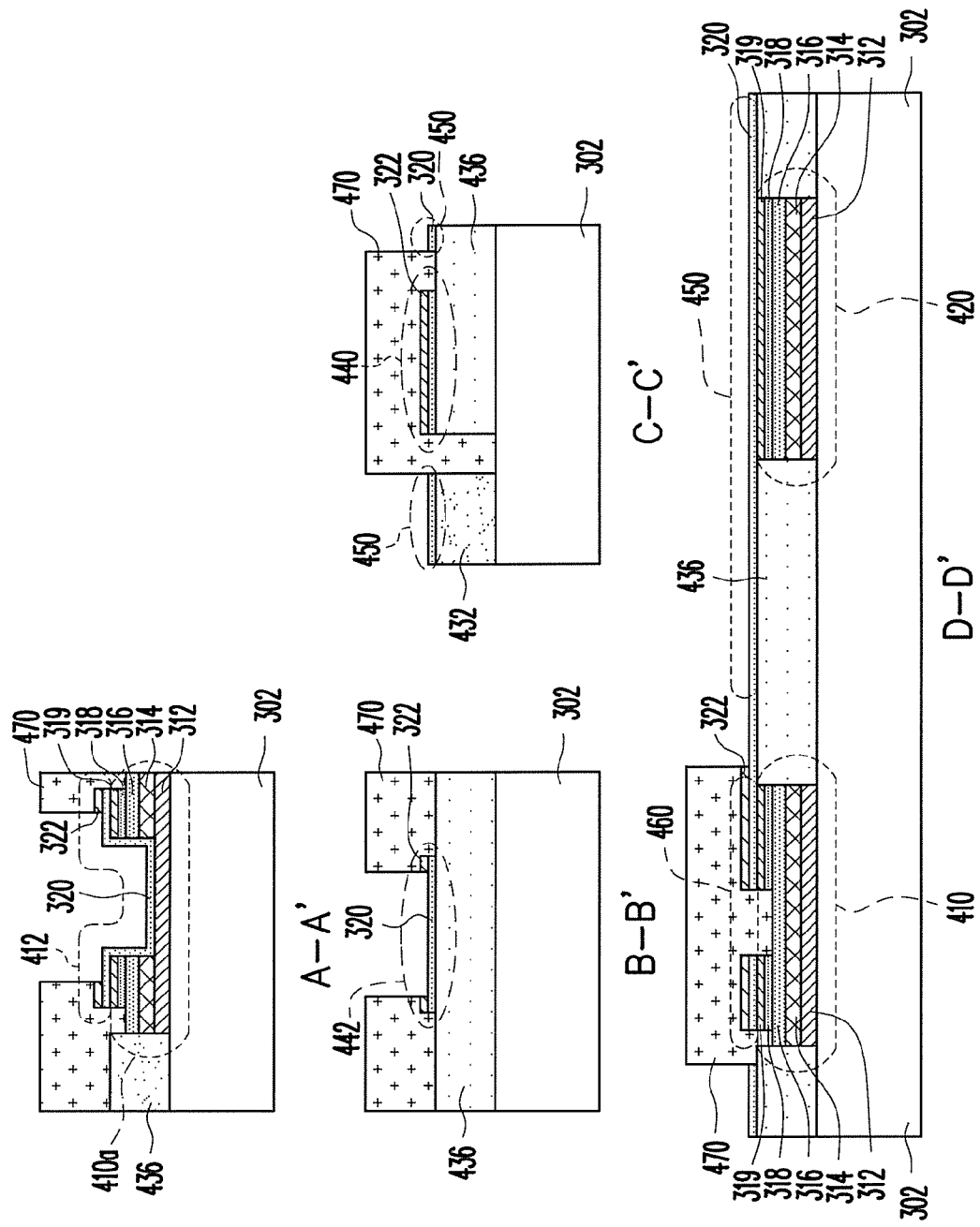

Then, as shown in FIGS. 3G and 4G, the second conductive layer 322 in the gate terminal port contacts 412, the data terminal port contacts 442 and the electrode patterns 450 is removed with the black matrix 470 as a mask, wherein the method of removing the second conductive layer 322 is, for example, the dry etching. In other words, after the etching process, the transparent electrode layer 320 under the electrode patterns 450 is exposed to serve as pixel electrodes, and the transparent electrode layer 320 under the gate terminal port contacts 412 and the data terminal port contacts 442 is also exposed.

Through the above-mentioned plurality of steps, the manufacture of the TFT array substrate of the present invention is substantially finished, and the obtained TFT array substrate is shown in FIGS. 3G and 4G. A multi-layer structure composed of the first conductive layer 312, the insulating layer 314 and the channel layer 316 over the substrate 302 constitutes the gate lines 410 and the gate terminal ports 410a on the substrate 302, and each gate terminal port 410a has an opening for exposing the first conductive layer 312. The color filter patterns 432, 434 and 436 are disposed over the substrate 302 and expose parts of the multi-layer structure. The data lines 440 are disposed on the color filter patterns 432, 434 and 436, and intersected with the gate lines 410, so as to form a plurality of sub-pixel areas 302a on the substrate 302.

Moreover, the gate terminal port contacts 412 are disposed on the corresponding gate terminal ports 410a, and respectively coupled to the first conductive layer 312 exposed through the openings. The data terminal port contacts 442 are connected to terminals of the corresponding data lines 440. The pixel electrodes 450 are disposed in the corresponding sub-pixel areas 302a, and located on the corresponding color filer patterns 432, 434 and 436. The sources/drains 460 are located over the gate lines 410 corresponding to the sub-pixel areas 302a, so as to constitute TFTs with the first conductive layer 312 and the semiconductor layer 316 respectively. The sources/drains 460 are connected to the corresponding data lines 440 and the pixel electrodes 450 respectively. The black matrix 470 is disposed over the substrate 302, and used for exposing the pixel electrodes 450.

In the embodiment, the multi-layer structure may further comprise the ohmic contact layer 318 and the contact metal layer 319. The common lines 420 parallel to and alternately arranged with the gate lines 410 may be further formed, and the color filter patterns 432, 434 and 436 are used to expose the common lines 420 simultaneously. Moreover, the sources/drains 460 in the embodiment are formed by the transparent conductive layer 320 and the second metal layer 322, wherein the second metal layer 322 is located on the transparent conductive layer 320. The pixel electrodes 450, the gate terminal port contacts 412 and the data terminal port contacts 442 may also be formed by the transparent conductive layer 320. When the sources/drains 460 are manufactured, the pixel electrodes 450, the gate terminal port contacts 412 and the data terminal port contacts 442 are, for example, formed simultaneously, and then, they are obtained by removing the second metal layer 322 by the etching process.

It should be noted that the TFT array substrate may be directly assembled with an opposite substrate to constitute a liquid crystal display panel. Since the TFT array substrate has been integrated with color filter patterns in the present invention, only the transparent common electrode needs to be manufactured on the opposite substrate. Thus, there is no need to worry that the aligning error occurs to the color filter patterns during the alignment process, and it is helpful for increasing the production yield. Moreover, the black matrix of the TFT array substrate of the present invention not only has a shading effect, but also serves as a spacer between the TFT array substrate and the opposite substrate for maintaining the cell gap between the TFT array substrate and the opposite substrate.

In the embodiment, since the material composition of the color filter patterns is complex and it may have ions, the channel layer may be polluted by the ions. In order to avoid the problem, the present invention further provides another TFT array substrate and a method for manufacturing the same. Referring to FIGS. 5A-5G in sequence, they sequentially show another method of manufacturing a TFT array substrate according to another preferred embodiment of the present invention. Reference numerals the same as that of the above embodiment are used in this embodiment to indicate similar components, and processing steps and materials or the thickness and other features of the relevant film layers will not be repeated herein any more, which can be obtained with reference to the content of the above embodiments.

Figure 5A:
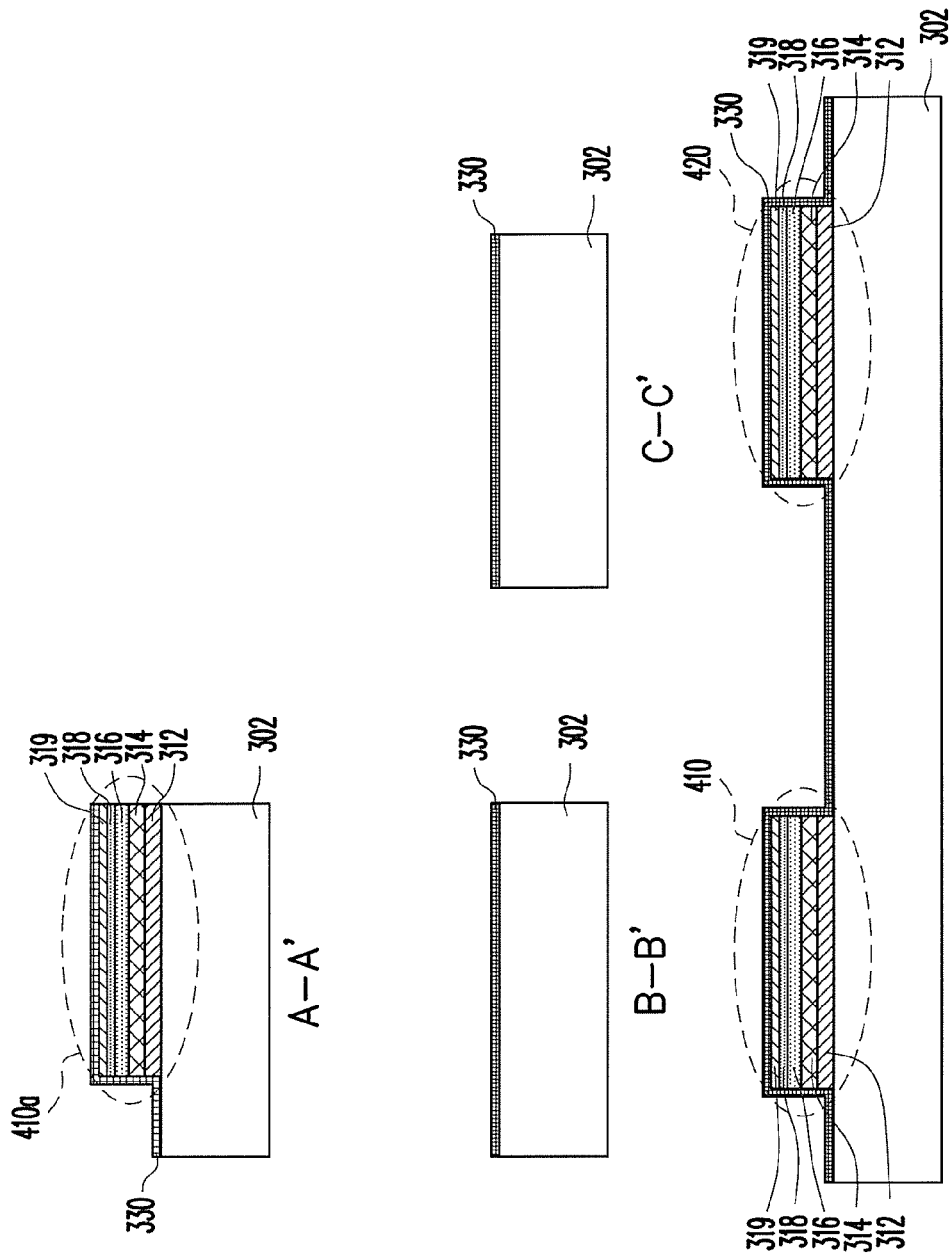
FIGS. 5A-5G sequentially show another method of manufacturing a TFT array substrate according to a preferred embodiment of the present invention.

Firstly, as shown in FIG. 5A, in this embodiment, a patterned composite layer is formed on the substrate 302, which includes a first conductive layer 312, an insulating layer 314 and a channel layer 316, even an ohmic contact layer 318 and a contact metal layer 319, so as to form the gate lines 410, the gate terminal ports 410a, and the common lines 420. Then, a protective layer 330 is completely formed over the substrate 302, with a thickness of about 0.1-0.3 μm and the material of the protective layer 330 is, for example, $SiN_x$.

Figure 5B:
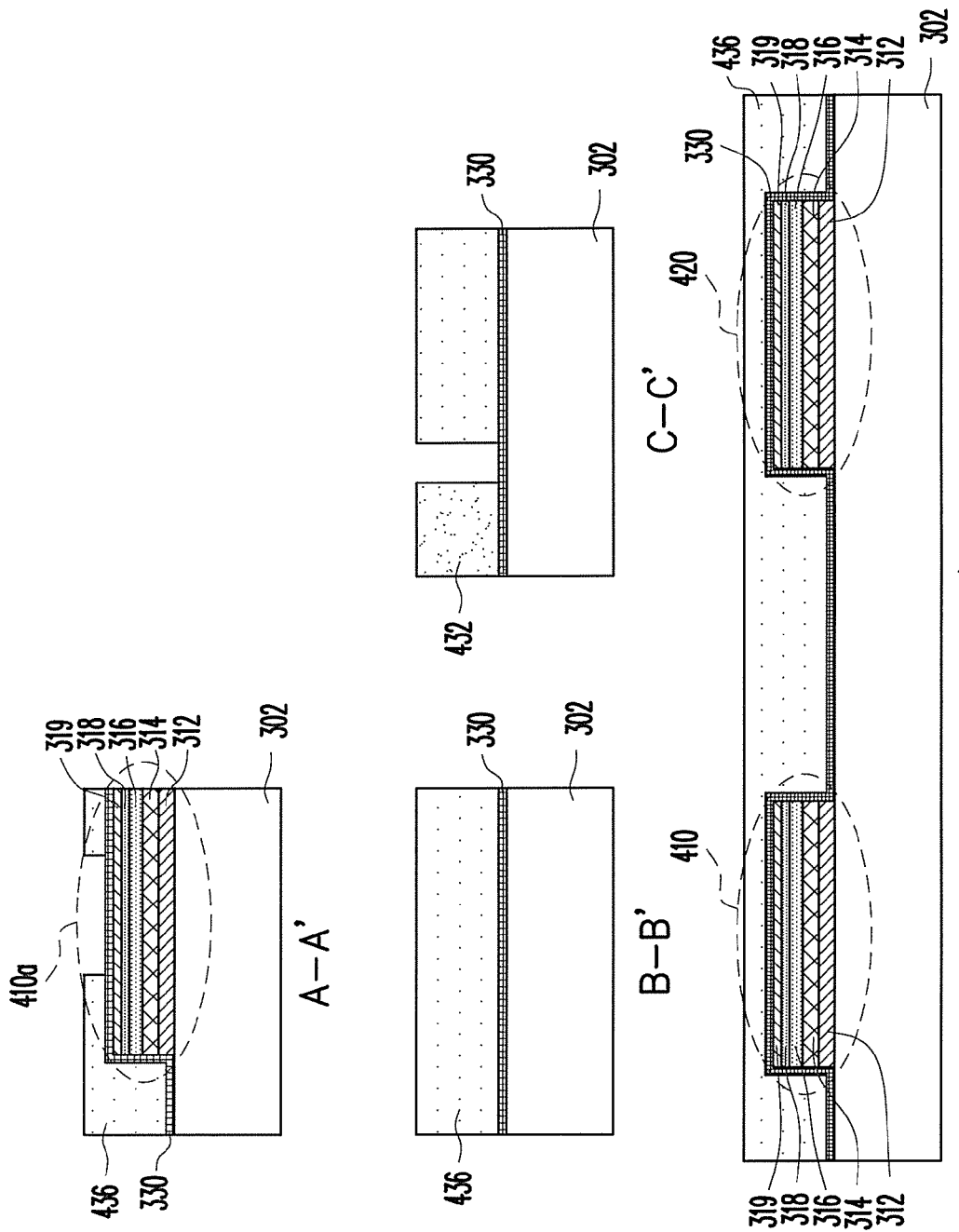
Figure 5C:
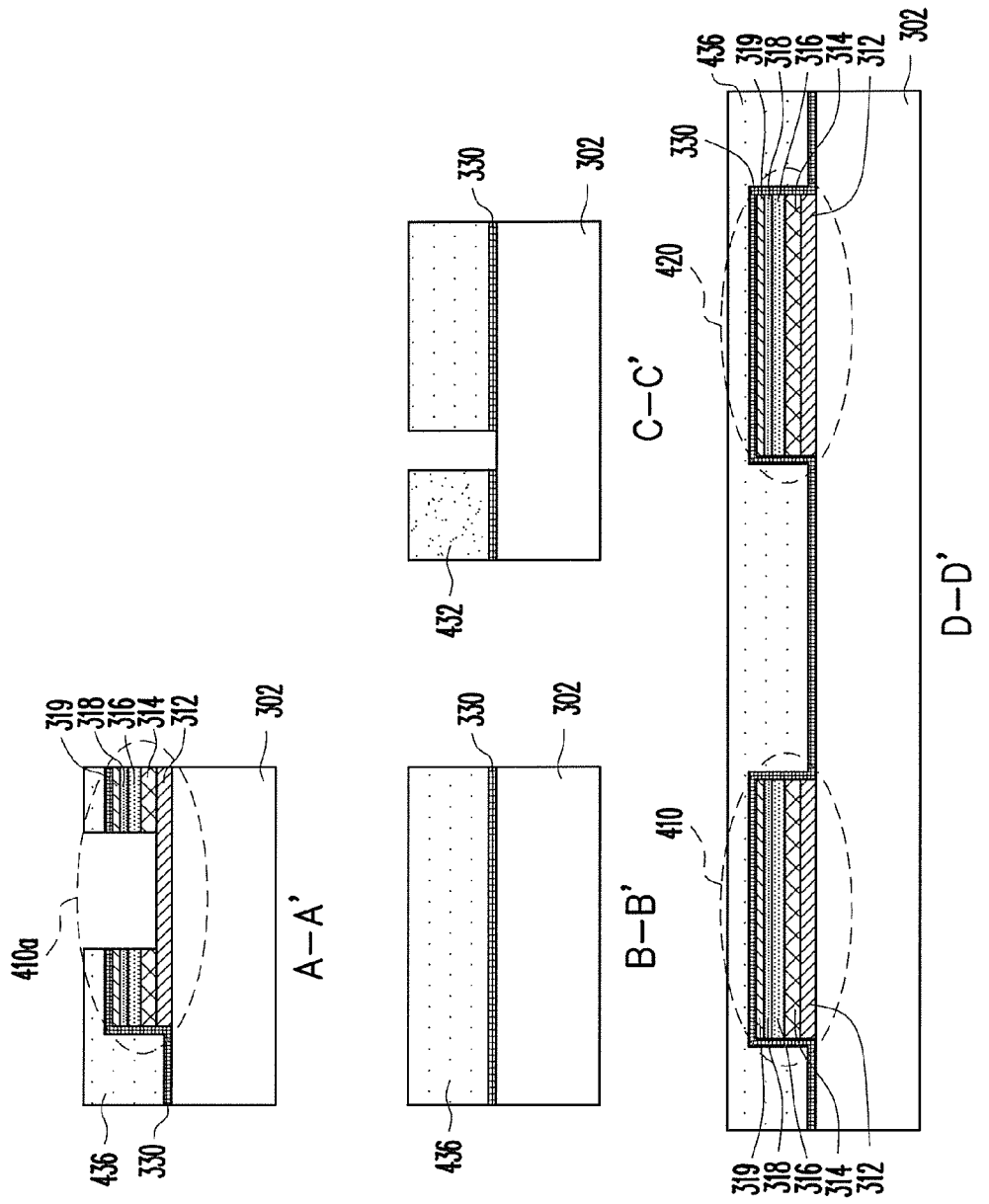

Then, as shown in FIG. 5B, color filter layers with different colors are sequentially formed over the substrate 302. For example, red filter patterns 432, green filter patterns (not shown) and blue filter patterns 436 are included, wherein the blue filter patterns 436 cover a part of each corresponding gate terminal port 410a. As shown in FIG. 5C, an etching process (for example, the dry etching) is performed with the red filter patterns 432, the green filter patterns (not shown) and the blue filter patterns 436 as a mask, so as to remove film layers without being covered by the red filter patterns 432, the green filter patterns (not shown) and the blue filter patterns 436, wherein the film layers include the protective layer 330, the insulating layer 314, the channel layer 316, the ohmic contact layer 318, the contact metal layer 319 and others, and thereby exposing a part of the first conductive layer 312, including the first conductive layer 312 in the gate terminal ports 410a.

Figure 5D:
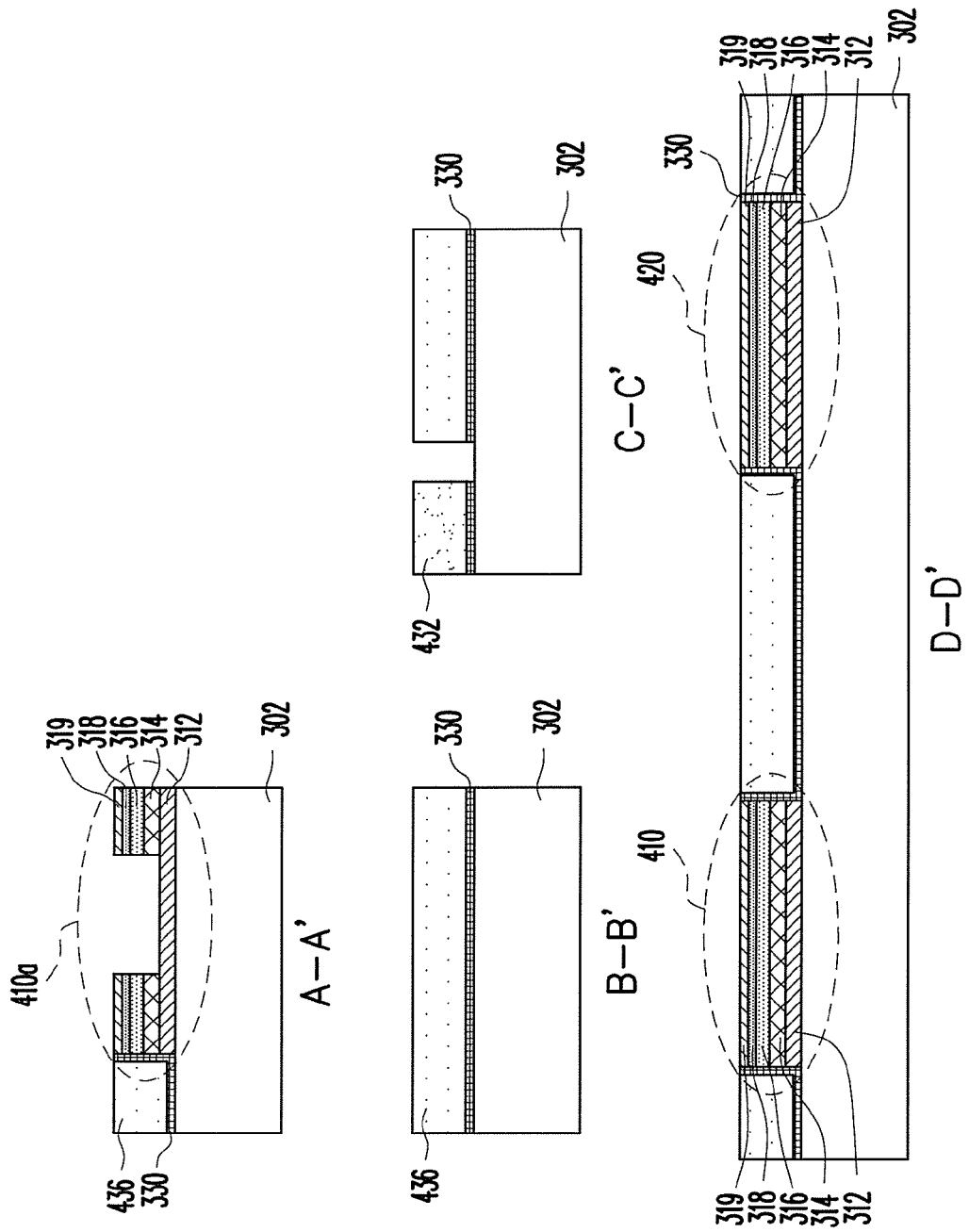

Then, as shown in FIG. 5D, a partial thickness of the color filter patterns 432, 434 and 436 are removed by, for example, the ashing process, and a part of the protective layer 330 is removed, so as to expose the gate lines 410. This process also exposes the common lines 420 as the common lines 420 have been formed.

Figure 5E:
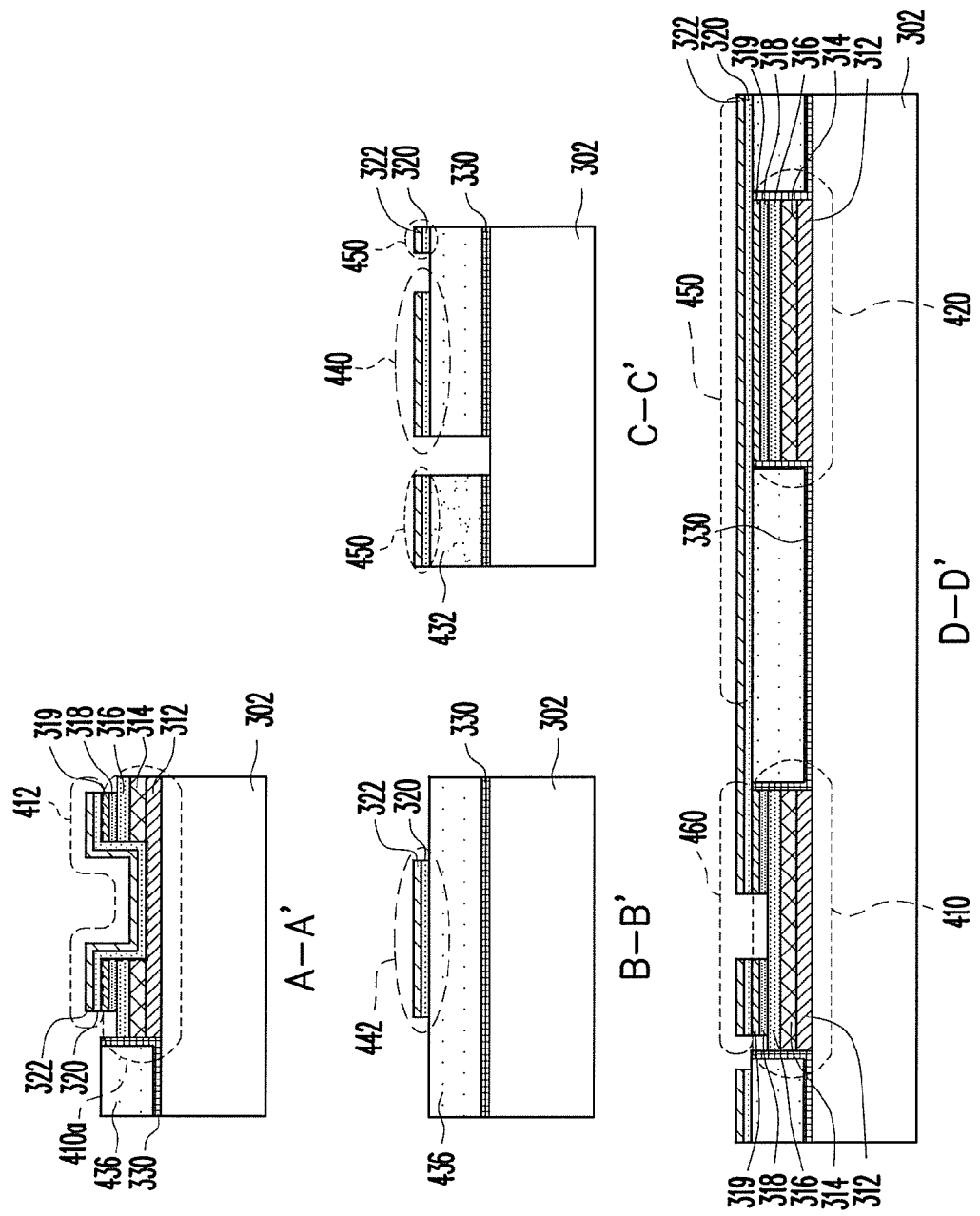

Then, as shown in FIG. 5E, a step similar to that shown in FIGS. 3E and 4E of the above embodiment is performed. The patterned transparent electrode layer 320 and the patterned second conductive layer 322 are formed over the substrate 302, so as to form the gate terminal port contacts 412, the data lines 440, the data terminal port contacts 442, the electrode patterns 450 and the sources/drains 460. The contact metal layer 319 and the ohmic contact layer 318 exposed by the second conductive layer 322 and the transparent electrode layer 320 are further removed, such that the sources/drains 460 and the channel layer 316 and the first metal layer 312 under the sources/drains 460 constitute TFTs.

Figure 5F:
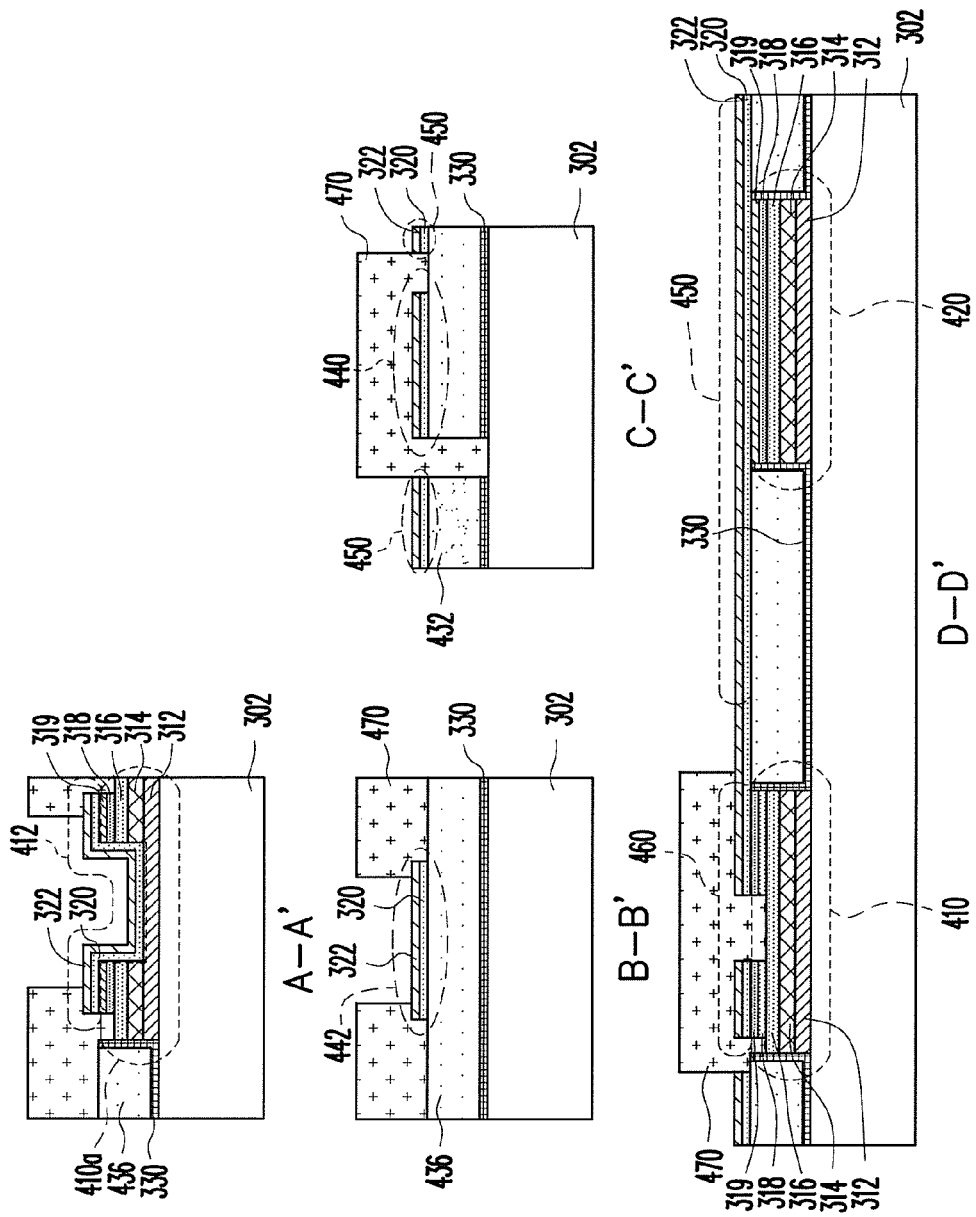
Figure 5G:
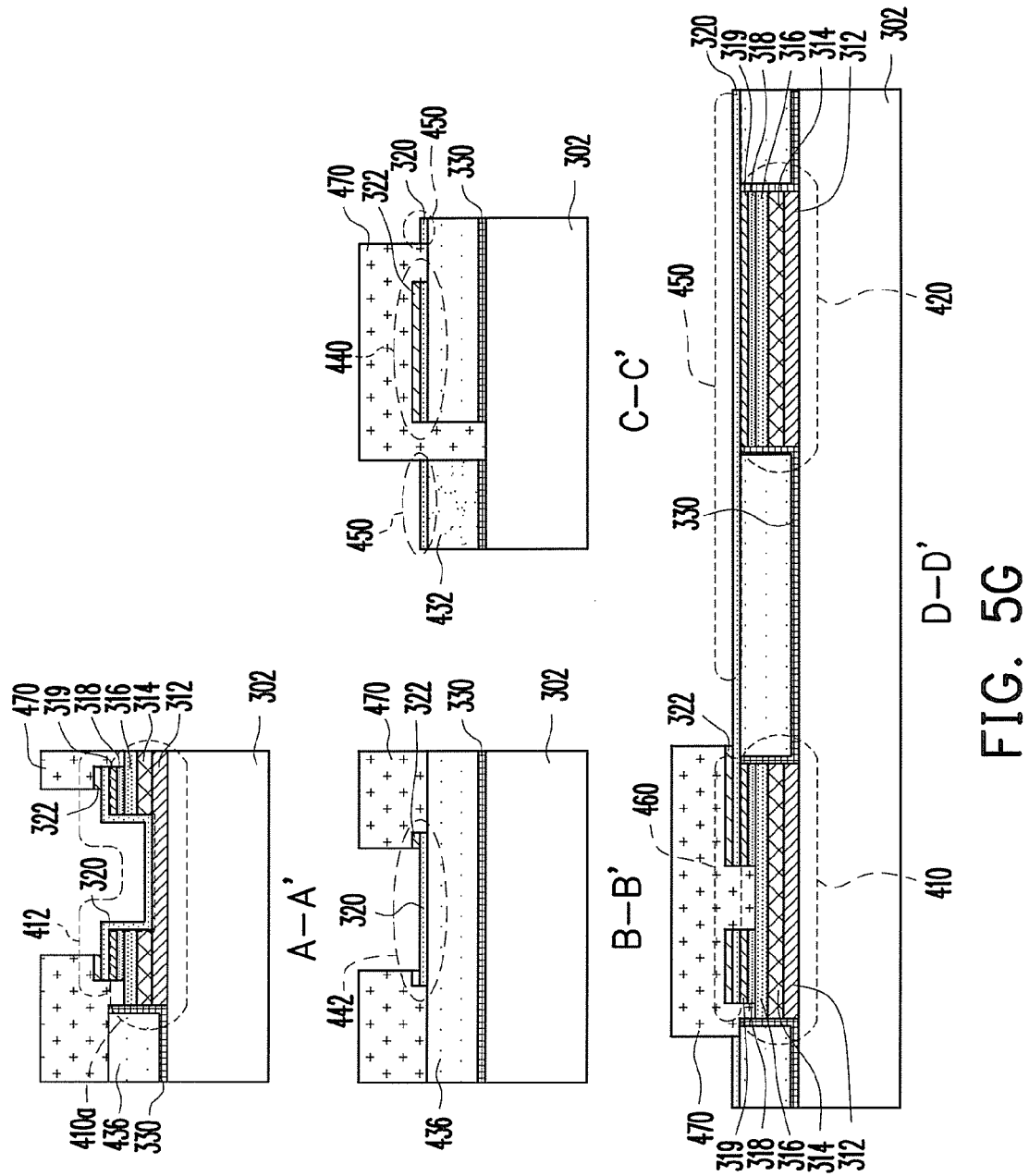

Then, as shown in FIG. 5F, a step similar to that shown in FIGS. 3F and 4F of the above embodiment is performed. The black matrix 470 is formed over the substrate 302. The second conductive layer 322 in the gate terminal port contacts 412, the data terminal port contacts 442 and the electrode patterns 450 is removed with the black matrix 470 as a mask, so as to expose the transparent electrode layer 320 under the electrode patterns 450 to serve as pixel electrodes, and to expose the transparent electrode layer 320 under the gate terminal port contacts 412 and the data terminal port contacts 442, as shown in FIG. 5G.

The protective layer 330 is formed between the color filter patterns and the substrate 302 and between the color filter patterns and the composite layer in the present invention, thus, the channel layer is effectively prevented from being polluted by ions in the color filter patterns. It should be noted that, the same as the over embodiment, this embodiment only needs six or even less mask processes for forming a TFT array substrate integrated with the color filter patterns.

To sum up, the TFT array substrate and the manufacturing process provided in the present invention have at least the following features and advantages.

(1) The method of manufacturing the TFT array substrate provided by the present invention needs fewer mask processes, so it is relatively simple to be implemented and has a relatively low manufacturing cost.

(2) The present invention does not need to form contact windows in relatively thick film layers (such as the planarization layer and the color filter layer) as the conventional art, to connect the pixel electrodes to the sources/drains, so the difficulty of the manufacturing process is effectively reduced, and the yields are further enhanced.

(3) The TFT array substrate of the present invention is integrated with the manufacture of the color filter patterns, which is helpful for enhancing the resolution of the liquid crystal display panel and the aperture ratio of the pixels, and thereby, the aligning error possibly generated when the color filter substrate is assembled with the TFT array substrate can be avoided.

(4) The black matrix over the TFT array substrate of the present invention not only has a shading effect, but also serves as a spacer between the TFT array substrate and the opposite substrate, for maintaining the cell gap between the TFT array substrate and the opposite substrate.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method of manufacturing a thin film transistor (TFT) array substrate, comprising:
   providing a substrate;
   sequentially forming a first conductive layer, a insulating layer, a channel layer, and an ohmic contact layer over the substrate, and simultaneously patterning the first conductive layer, the insulating layer, the channel layer, and the ohmic contact layer, to form a plurality of gate lines parallel to each other on the substrate, and each gate line having a gate terminal port at a terminal;
   forming a plurality of color filer patterns over the substrate;
   removing at least a part of the insulating layer and the channel layer of each gate terminal port to expose the first conductive layer in the gate terminal port;
   removing a partial thickness of the color filter patterns to expose the gate lines;

forming a patterned transparent electrode layer and a patterned second conductive layer to form a plurality of data lines, a plurality of electrode patterns and a plurality of sources/drains, wherein the data lines are parallel to each other and intersected with the gate lines to form a plurality of sub-pixel areas on the substrate, the electrode patterns are correspondingly located in the sub-pixel areas, the sources/drains are corresponding to the sub-pixel areas and disposed over the corresponding gate lines, and each source/drain is respectively connected to the corresponding data line and the corresponding electrode pattern;

removing the ohmic contact layer exposed by the second conductive layer and the transparent electrode layer after forming the patterned transparent electrode layer and the patterned second conductive layer;

forming a black matrix over the substrate for at least exposing the electrode patterns; and removing the second conductive layer in the electrode patterns with the black matrix as a mask.

2. The method of claim 1, further comprising forming a plurality of gate terminal port contacts and a plurality of data terminal port contacts when the patterned transparent electrode layer and the patterned second conductive layer are formed, wherein the gate terminal port contacts are correspondingly located on the exposed first conductive layer of the gate terminal ports, and a terminal of each data line is correspondingly connected to a data terminal port contact.

3. The method of claim 2, wherein the gate terminal port contacts and the data terminal port contacts are further exposed by the black matrix, when the black matrix is formed over the substrate.

4. The method of claim 3, further comprising removing the second conductive layer in the gate terminal port contacts and the data terminal port contacts with the black matrix as a mask.

5. The method of claim 1, further comprising forming a contact metal layer after forming the ohmic contact layer, and then, patterning the first conductive layer, the insulating layer, the channel layer, the ohmic contact layer and the contact metal layer altogether; and removing the contact metal layer and the ohmic contact layer exposed by the second conductive layer and the transparent electrode layer after forming the transparent electrode layer and the patterned second conductive layer.

6. The method of claim 1, wherein when the gate lines are formed on the substrate, a plurality of common lines parallel to and alternately arranged with the gate lines are further formed.

7. The method of claim 1, wherein the step of forming the color filter patterns comprises sequentially forming color filter layers with different colors over the substrate.

8. The method of claim 7, wherein when forming the color filter patterns, the color filter layer with any one color covers at least a part of each gate terminal port to be as a mask for removing at least a part of the insulating layer and the channel layer of each gate terminal port, and thereby exposing the first conductive layer.

9. The method of claim 1, wherein after forming the gate lines and before forming the color filter patterns, the method further comprises forming a protective layer over the substrate; and when removing a partial thickness of the color filter patterns, the method further comprises removing the protective layer on the gate lines for exposing the gate lines.

10. The method of claim 9, wherein when the gate lines are formed on the substrate, a plurality of common lines parallel to and alternately arranged with the gate lines are further formed; and when the protective layer on the gate lines is removed, the protective layer on the common lines is also removed to expose both the gate lines and the common lines simultaneously.

* * * * *